United States Patent
Fukami et al.

(10) Patent No.: US 8,159,872 B2
(45) Date of Patent: Apr. 17, 2012

(54) MAGNETIC RANDOM ACCESS MEMORY

(75) Inventors: Shunsuke Fukami, Tokyo (JP);
Nobuyuki Ishiwata, Tokyo (JP);
Tetsuhiro Suzuki, Tokyo (JP); Norikazu Ohshima, Tokyo (JP); Kiyokazu Nagahara, Tokyo (JP)

(73) Assignee: NEC Corporation, Tokyo (JP)

( * ) Notice: Subject to any disclaimer, the term of this patent is extended or adjusted under 35 U.S.C. 154(b) by 70 days.

(21) Appl. No.: 12/865,197

(22) PCT Filed: Jan. 9, 2009

(86) PCT No.: PCT/JP2009/050185
§ 371 (c)(1),
(2), (4) Date: Jul. 29, 2010

(87) PCT Pub. No.: WO2009/104427
PCT Pub. Date: Aug. 27, 2009

(65) Prior Publication Data
US 2010/0309713 A1   Dec. 9, 2010

(30) Foreign Application Priority Data
Feb. 19, 2008 (JP) .................................. 2008-038067

(51) Int. Cl.
*G11C 11/15* (2006.01)
(52) U.S. Cl. ........ 365/173; 365/148; 365/158; 365/171; 977/933; 977/935
(58) Field of Classification Search .................... 365/48, 365/55, 62, 66, 74, 78, 80–93, 100, 130, 365/131, 148, 158, 171–173, 209, 213, 225.5, 365/230.07, 232, 243.5; 216/22; 257/295, 257/421, E21.665; 438/3; 428/810–816, 428/817–825.1, 826; 977/933–935
See application file for complete search history.

(56) References Cited

U.S. PATENT DOCUMENTS
2010/0110777 A1 * 5/2010 Katou et al. .................. 365/158
(Continued)

FOREIGN PATENT DOCUMENTS
JP   2005116888 A   4/2005
(Continued)

OTHER PUBLICATIONS

A. Thiaville et al., "Micromagnetic understanding of current-driven domain wall motion in patterned nanowires", Europhysics Letters, vol. 69, Mar. 15, 2005, pp. 990-996.

(Continued)

Primary Examiner — Richard Elms
Assistant Examiner — Harry W Byrne

(57) ABSTRACT

An MRAM has: a memory cell including a first magnetoresistance element; and a reference cell including a second magnetoresistance element. The first magnetoresistance element has a first magnetization fixed layer, a first magnetization free layer, a first nonmagnetic layer sandwiched between the first magnetization fixed layer and the first magnetization free layer, a second magnetization fixed layer, a second magnetization free layer and a second nonmagnetic layer sandwiched between the second magnetization fixed layer and the second magnetization free layer. The first magnetization fixed layer and the first magnetization free layer have perpendicular magnetic anisotropy, and the second magnetization fixed layer and the second magnetization free layer have in-plane magnetic anisotropy. The first magnetization free layer and the second magnetization free layer are magnetically coupled to each other. Center of the second magnetization free layer is displaced in a first direction from center of the first magnetization free layer in a plane parallel to each layer. Whereas, the second magnetoresistance element has: a third magnetization free layer whose magnetization easy axis is parallel to a second direction; a third magnetization fixed layer whose magnetization direction is fixed in a third direction perpendicular to the second direction; and a third nonmagnetic layer sandwiched between the third magnetization fixed layer and the third magnetization free layer. The third magnetization fixed layer and the third magnetization free layer have in-plane magnetic anisotropy.

14 Claims, 30 Drawing Sheets

U.S. PATENT DOCUMENTS

2010/0182824 A1* 7/2010 Nebashi et al. .............. 365/158

FOREIGN PATENT DOCUMENTS

| | | | |
|---|---|---|---|
| JP | 2005150303 A | 6/2005 | |
| JP | 2005191032 A | 7/2005 | |
| JP | 2006073930 A | 3/2006 | |
| JP | 2006270069 A | 10/2006 | |
| JP | 2007103663 A | 4/2007 | |
| JP | 2007142364 A | 6/2007 | |
| JP | 2007258460 A | 10/2007 | |
| JP | 2008147488 A | 6/2008 | |
| JP | 2009054715 A | 3/2009 | |

OTHER PUBLICATIONS

N. Sakimura et al., "MRAM Cell Technology for Over 500MHz SoC", 2006 Sympoyium on VLSI Circuits, Digest of Technical Papers, 2006, pp. 136.

A. Yamaguchi et al., "Real-Space Observation of Current-Driven Domain Wall Motion in Submicron Magnetic Wires", Physical Review Letters, vol. 92, No. 7, Feb. 20. 2004, pp. 077205-1~4.

A. Yamaguchi et al., "Reduction of Threshold Current Density for Current-Driven Domain Wall Motion using Shape Control", Japanese Journal of Applied Physics, vol. 45, No. 5A, 2006, pp. 3850-3853.

D. Ravelosona et al., "Threshold currents to move domain walls in films with perpendicular anisotropy", Applied Physics Letters, vol. 90, 2007, p. 072508-1~3.

International Search Report for PCT/JP2009/050185 mailed Apr. 14, 2009.

J. Hayakawa et al., "Effect of high annealing temperature on giant tunnel magnetoresistance ratio of CoFeB/MgO/CoFeB magnetic tunnel junctions", Applied Physics Letters, vol. 89, 2006, pp. 232510-1~3.

* cited by examiner

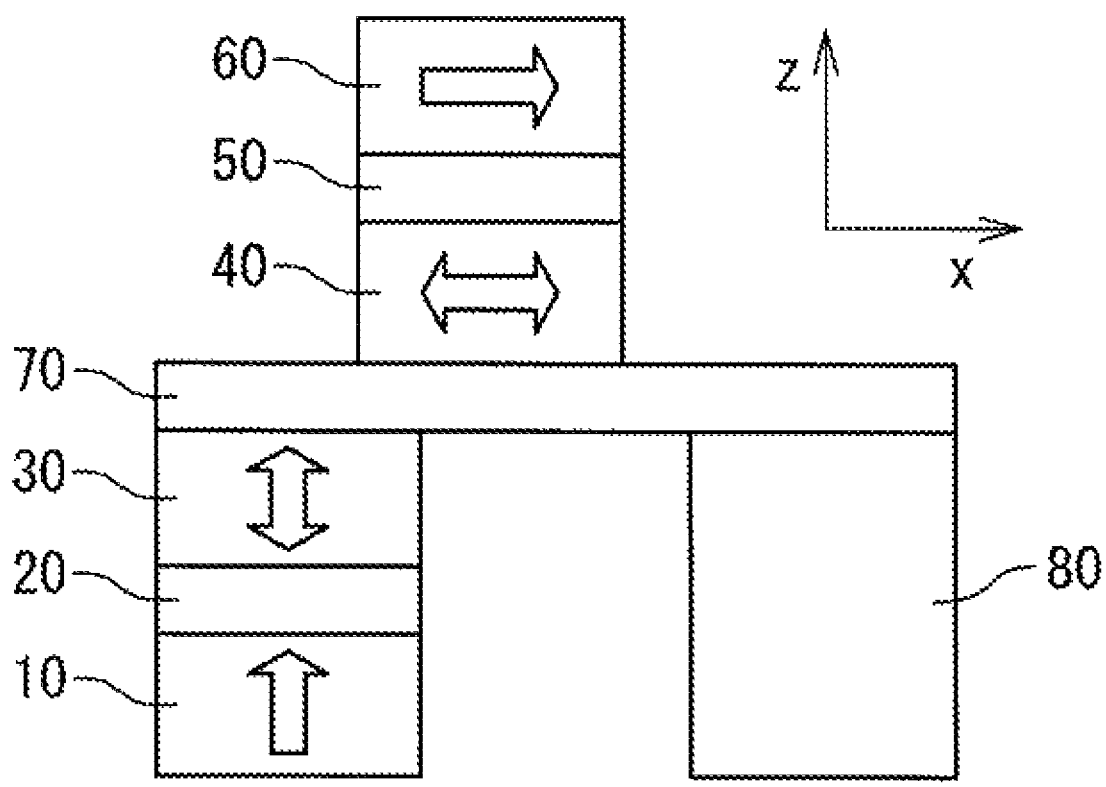

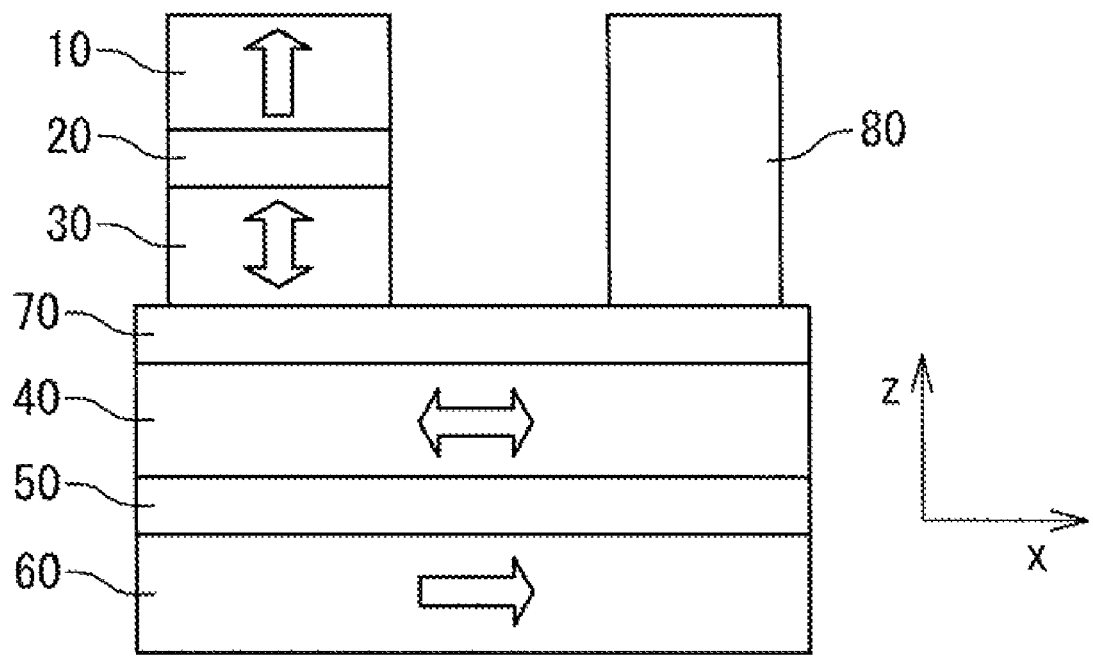

MAGNETIC RANDOM ACCESS MEMORY

This application is the National Phase of PCT/JP2009/050185, filed Jan. 9, 2009 which is based upon and claims the benefit of priority from Japanese patent application No. 2008-038067, filed on Feb. 19, 2008, the disclosure of which is incorporated herein in its entirely by reference.

TECHNICAL FIELD

The present invention relates to a magnetic random access memory (MRAM: Magnetic Random Access Memory). In particular, the present invention relates to an MRAM based on spin transfer magnetization switching method.

BACKGROUND ART

An MRAM is a nonvolatile random access memory that utilizes a magnetoresistance element such as a magnetic tunnel junction (Magnetic Tunnel Junction; MTJ) element as a memory element. Since the MRAM is capable of achieving high-speed operation and can have infinite rewrite tolerance, research and development of the MRAM have been actively carried out to achieve commercialization in recent years. To further improve the versatility of the MRAM hereafter requires reduction in a write current and increase in a read-out signal. The reason is that the reduction in the write current not only lowers operation power consumption but also reduces costs due to reduction in a chip area, and the increase in the read-out signal shortens a read time which enables a higher-speed operation.

As a write method for reducing the write current, the following spin transfer magnetization switching method has been proposed. Let us consider, for example, a memory element in which a first magnetic layer having reversible magnetization, a nonmagnetic layer and a second magnetic layer whose magnetization direction is fixed are stacked. According to the spin transfer magnetization switching method, a write current is supplied between the second magnetic layer and the first magnetic layer, and interaction between spin-polarized conduction electrons of the write current and local electrons in the first magnetic layer causes switching of the magnetization of the first magnetic layer. To directly supply the current in the memory element at the time of data writing is one of major differences as compared with a typical write method; a magnetic field application method (a method that supplies a write current to an interconnection arranged near the memory element and applies a resultant magnetic field to switch the magnetization of the first magnetic layer). Moreover, in the case of the spin transfer magnetization switching method, the magnetization switching (writing) is caused when current density excesses a certain threshold value. Since the current density is increased as a cell size is reduced, the write current can be made smaller with miniaturization. That is, scaling property of the write current is improved. Japanese Patent Publication JP-2007-142364 (hereinafter referred to as "Patent Document No. 1") discloses material characteristics which can make the threshold current density for the magnetization switching equal to or less than a desired value. According to it, it is possible to reduce the threshold current density by using a perpendicular magnetization film as a magnetic layer and adjusting magnetic anisotropy energy density and saturation magnetization as appropriate.

Whereas, to increase a magnetoresistance ratio (MR ratio) of the magnetoresistance element is most effective for increasing the read-out signal. Development of an MTJ element that exhibits a high magnetoresistance ratio has been actively performed in recent years. Hayakawa et al., "Effect of high annealing temperature on giant tunnel magnetoresistance ratio of CoFeB/MgO/CoFeB magnetic tunnel junctions", APPLIED PHYSICS LETTERS, Vol. 89, p. 232510, 2006 (hereinafter referred to as Non-patent Document No. 1) reports that a giant MR ratio (about 500% at room temperature) can be obtained in the Co—Fe—B/Mg—O/Co—Fe—B MTJ. The reasons that such a high MR ratio can be obtained in the Co—Fe—B/Mg—O/Co—Fe—B MTJ are considered to be as follows: (1) Co—Fe—B has high spin polarization, (2) (001)-oriented polycrystalline MgO that exhibits high spin filtering effect is formed by annealing Mg—O sandwiched between amorphous Co—Fe—B at high temperature.

As described above, in the case of the spin transfer magnetization switching method, a perpendicular magnetization film whose material characteristics are adjusted as appropriate can be used as a magnetic layer in order to reduce the write threshold current density and hence reduce the write current of the MRAM. Whereas, an MTJ consisting of a magnetic layer having high spin polarization and an insulating layer exhibiting high spin filtering effect can be used in order to increase the MR ratio and hence increase the read-out signal of the MRAM.

However, when the perpendicular magnetization film having appropriate material characteristics is used as the magnetic layer for reducing the write threshold current density, it is difficult to develop an MTJ exhibiting a high MR ratio. The above-mentioned Patent Document No. 1 describes that the saturation magnetization being smaller is a preferable material characteristic of the perpendicular magnetization film. Whereas, the spin polarization of a magnetic layer generally becomes higher as the saturation magnetization is larger and becomes lower as the saturation magnetization is smaller. Therefore, high spin polarization cannot be obtained by the material characteristic preferable for the perpendicular magnetization film, which makes it difficult to improve the MR ratio. That is to say, reduction in the write threshold current density and improvement of the MR ratio in the spin transfer magnetization switching conflict with each other.

Moreover, a Co—Fe—B thin film having high spin polarization is an in-plane magnetization film whose magnetic anisotropy is in a direction parallel to the film surface. When such an in-plane magnetization film is used as a magnetic layer, it is difficult to sufficiently reduce the write threshold current density in the spin transfer magnetization switching.

DISCLOSURE OF INVENTION

In the MRAM based on the spin transfer magnetization switching method, it is desirable to improve write characteristics and read characteristics independently of each other. In this case, however, a structure of the magnetoresistance element becomes complicated, which is likely to increase variation in magnetization state between memory cells in which the same data value is stored. In particular, if variation in magnetization state between reference cells is increased, variation in a reference level at a time of data reading also is increased.

An object of the present invention is to provide a technique that can suppress the variation in the reference level at the time of data reading, with respect to the MRAM based on the spin transfer magnetization switching method.

In an exemplary embodiment of the present invention, an MRAM based on the spin transfer magnetization switching method is provided. The MRAM has: a memory cell; and a reference cell which is referred to for generating a reference level at a time of data reading. The memory cell includes a first magnetoresistance element, and the reference cell includes a second magnetoresistance element.

The first magnetoresistance element has: a first magnetization fixed layer whose magnetization direction is fixed; a first magnetization free layer whose magnetization direction is reversible; a first nonmagnetic layer sandwiched between the first magnetization fixed layer and the first magnetization free layer; a second magnetization fixed layer whose magnetization direction is fixed; a second magnetization free layer whose magnetization direction is reversible; and a second nonmagnetic layer sandwiched between the second magnetization fixed layer and the second magnetization free layer. The first magnetization fixed layer and the first magnetization free layer have perpendicular magnetic anisotropy, and the second magnetization fixed layer and the second magnetization free layer have in-plane magnetic anisotropy. The first magnetization free layer and the second magnetization free layer are magnetically coupled to each other. Center of the second magnetization free layer is displaced in a first direction from center of the first magnetization free layer in a first plane parallel to each layer.

The second magnetoresistance element has: a third magnetization free layer whose magnetization easy axis is parallel to a second direction; a third magnetization fixed layer whose magnetization direction is fixed in a third direction perpendicular to the second direction; and a third nonmagnetic layer sandwiched between the third magnetization fixed layer and the third magnetization free layer. The third magnetization fixed layer and the third magnetization free layer have in-plane magnetic anisotropy.

According to the present invention, it is possible to improve the write characteristics and the read characteristics independently of each other with respect to the MRAM based on the spin transfer magnetization switching method. Furthermore, it is possible to suppress the variation in the reference level at the time of data reading.

BRIEF DESCRIPTION OF DRAWINGS

The above and other objects, advantages and features of the present invention will be more apparent from the following description of certain exemplary embodiments taken in conjunction with the accompanying drawings.

FIG. 1C is a x-z side view of the structure shown in FIG. 1A.

FIG. 8C is a x-z side view of the structure shown in FIG. 8A.

DESCRIPTION OF EMBODIMENTS

A magnetoresistance element and an MRAM based on the spin transfer magnetization switching method according to an exemplary embodiment of the present invention will be described with reference to the attached drawings.

1. First Magnetoresistance Element 1-1. Configuration

Figure 1A:
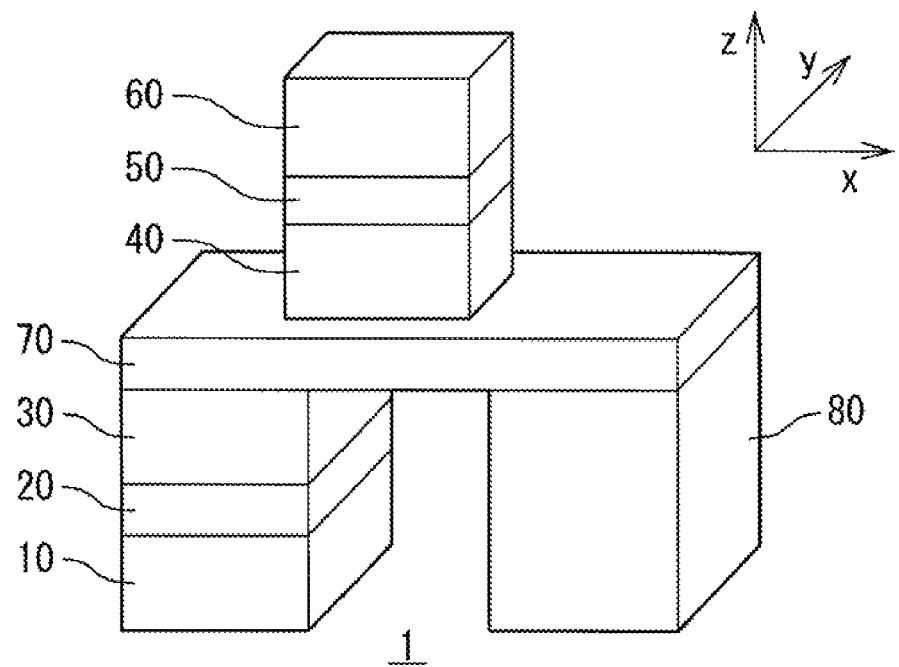
FIG. 1A is a perspective view showing an example of a first magnetoresistance element according to an exemplary embodiment of the present invention.
Figure 1B:
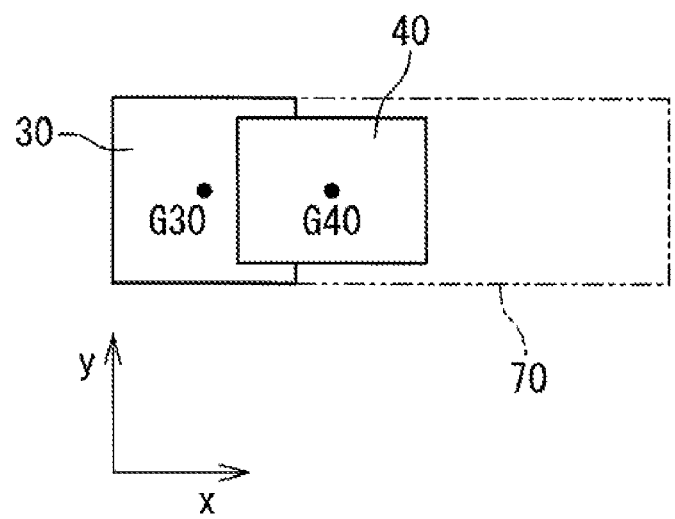
FIG. 1B is a x-y plan view of the structure shown in FIG. 1A.

FIG. 1A is a perspective view showing a structure of a first magnetoresistance element 1 according to an exemplary embodiment of the present invention. FIG. 1B and FIG. 1C respectively are a x-y plan view and a x-z side view of the structure shown in FIG. 1A. The first magnetoresistance element 3 has a stacked structure including a plurality of layers, and the stack direction is defined as the z-axis direction. A plane parallel to each layer of the stacked structure is the x-y plane.

The first magnetoresistance element 1 according to the present exemplary embodiment has a first magnetization fixed layer 10, a first spacer layer 20, a first magnetization free layer 30, a second magnetization free layer 40, a second spacer layer 50 and a second magnetization fixed layer 60. The first magnetization fixed layer 10 is provided adjacent to one surface of the first spacer layer 20, and the first magnetization free layer 30 is provided adjacent to the other surface of the first spacer layer 20. That is, the first spacer layer 20 is sandwiched between the first magnetization fixed layer 10 and the first magnetization free layer 30. The second magnetization fixed layer 60 is provided adjacent to one surface of the second spacer layer 50, and the second magnetization free layer 40 is provided adjacent to the other surface of the second spacer layer 50. That is, the second spacer layer 50 is sandwiched between the second magnetization fixed layer 60 and the second magnetization free layer 40.

In the example shown in FIGS. 1A to 1C, the first magnetoresistance element 1 further has a first conductive layer 70 and a second conductive layer 80. The first conductive layer 70 is so provided as to be electrically connected to the first magnetization free layer 30 and the second magnetization free layer 40. In particular, the first conductive layer 70 is sandwiched between the first magnetization free layer 30 and the second magnetization free layer 40 as shown in FIG. 1A and FIG. 1C. The second conductive layer 80 is so provided as to be electrically connected to the first conductive layer 70.

Each of the first spacer layer 20 and the second spacer layer 50 is a nonmagnetic layer formed of nonmagnetic material. Electrical characteristics of the first spacer layer 20 and the second spacer layer 50 are arbitrary, and material thereof can be any of conductor, insulator and semiconductor. It should be noted that the second spacer layer 50 is preferably formed of insulator.

Each of the first magnetization fixed layer 10, the first magnetization free layer 30, the second magnetization free layer 40 and the second magnetization fixed layer 60 is a ferromagnetic layer formed of ferromagnetic material. The first magnetization fixed layer 10 and the first magnetization free layer 30 among them are perpendicular magnetization films having perpendicular magnetic anisotropy. That is, the first magnetization fixed layer 10 and the first magnetization free layer 30 have magnetic anisotropy in a direction perpendicular to the film surface (in the z-axis direction). On the other hand, the second magnetization free layer 40 and the second magnetization fixed layer 60 are in-plane magnetization films having in-plane magnetic anisotropy. That is, the second magnetization free layer 40 and the second magnetization fixed layer 60 have magnetic anisotropy in a direction parallel to the film surface.

The magnetization direction of each layer is shown in FIG. 1C. The magnetization direction of the first magnetization fixed layer 10 is fixed substantially in one direction. On the other hand, the magnetization direction of the first magnetization free layer 30 is reversible. Since the first magnetization fixed layer 10 and the first magnetization free layer 30 have the perpendicular magnetic anisotropy, the magnetization direction thereof is substantially parallel to the z-axis. In the example shown in FIG. 1C, the magnetization of the first magnetization fixed layer 10 is fixed in the +z-direction. On the other hand, the magnetization of the first magnetization free layer 30 is allowed to be directed to the +z-direction or the −z-direction. That is, the magnetization direction of the first magnetization free layer 30 can be parallel to or antiparallel to the magnetization direction of the first magnetization fixed layer 10.

The magnetization direction of the second magnetization fixed layer 60 is fixed substantially in one direction. On the other hand, the magnetization direction of the second magnetization free layer 40 is reversible. Since the second magnetization fixed layer 60 and the second magnetization free layer 40 have the in-plane magnetic anisotropy, the magnetization direction thereof is substantially parallel to the film surface (x-y plane). In the example shown in FIG. 1C, the magnetization of the second magnetization fixed layer 60 is fixed in the +x-direction. On the other hand, the magnetization of the second magnetization free layer 40 has component in the +x-direction or in the −x-direction. That is, the magnetization direction of the second magnetization free layer 40 has component parallel to or anti-parallel to the magnetization direction of the second magnetization fixed layer 60.

Moreover, the first magnetization free layer 30 and the second magnetization free layer 40 are respectively formed in different layers but are magnetically coupled to each other. In other words, the magnetization state of the first magnetization free layer 30 and the magnetization state of the second magnetization free layer 40 mutually affect each other. It is important that the magnetization state of the first magnetization free layer 30 affects the magnetization state of the second magnetization free layer 40, as will be described later.

Furthermore, FIG. 1B shows locations of center G30 of the first magnetization free layer 30 and center G40 of the second magnetization free layer 40 in the x-y plane. The center here means geometric center in the x-y plane. That is, when a position vector Ri of an arbitrary point i of a geometric configuration is represented by Ri=(Xi, Yi), a position vector Rg=(Xg, Yg) of its center satisfies a relationship: $\Sigma i(Ri-Rg)=0$, wherein $\Sigma i$ means summation with regard to i. For example, in cases of rectangle and parallelogram, the center is an intersection of diagonal lines, and in a case of ellipse, the center is a center of the ellipse.

According to the present exemplary embodiment, the center G30 of the first magnetization free layer 30 and the center G40 of the second magnetization free layer 40 are displaced from each other in the x-y plane. That is, in the x-y plane, the center G40 of the second magnetization free layer 40 is displaced from the center G30 of the first magnetization free layer 30 in a "first direction" parallel to the film surface. In the example shown in FIG. 1B, the first direction (displacement direction) is the +x-direction. The first magnetization free layer 30 and the second magnetization free layer 40 may at least partially overlap with each other or may not overlap with each other.

It should be noted that a shape of each layer in the x-y plane is not limited to rectangle but can be circle, ellipse, diamond, hexagon and the like.

1-2. Principle

Figure 2A:
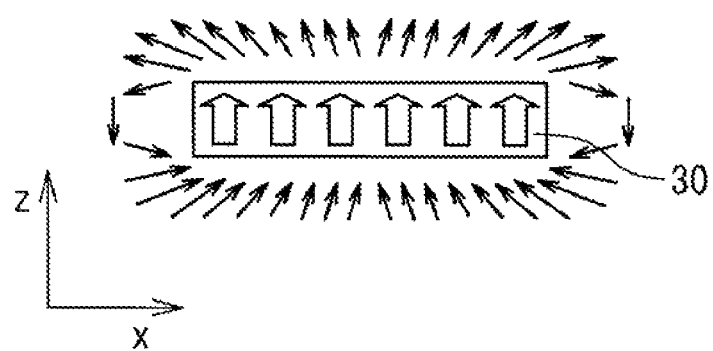
FIG. 2A is a conceptual diagram for explaining principle of the first magnetoresistance element.
Figure 2B:
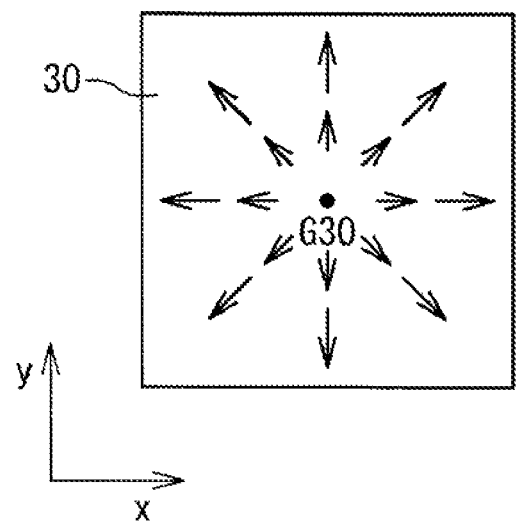
FIG. 2B is a conceptual diagram for explaining principle of the first magnetoresistance element.

Next, principle of the first magnetoresistance element 1 according to the present exemplary embodiment will be described in detail. FIG. 2A and FIG. 2B schematically illustrate leakage magnetic field (leakage magnetic flux) generated around the first magnetization free layer 30 due to its magnetization. FIG. 2A shows the state in the x-z plane, while FIG. 2B shows the state in the x-y plane.

Let us consider a case where the magnetization direction of the first magnetization free layer 30 is in the +z-axis direction with uniformity. In this case, magnetic field lines of the leakage magnetic field have a roughly dipole configuration as shown in FIG. 2A, namely depart from an upper surface (positive magnetic pole side) of the first magnetization free layer 30 and smoothly connect to a lower surface (negative magnetic pole side) thereof. Moreover, as shown in FIG. 2B, the leakage magnetic field radiates outward from the center G30 of the first magnetization free layer 30. That is, the leakage magnetic field in the vicinity of the center G30 of the first magnetization free layer 30 is nearly in the z-direction, and the leakage magnetic field has a larger xy component (component in the direction parallel to the film surface) as closer to an edge of the first magnetization free layer 30.

As described above, in the x-y plane, the center G40 of the second magnetization free layer 40 is displaced in the "first direction" from the center G30 of the first magnetization free layer 30. Therefore, the leakage magnetic field generated by the magnetization of the first magnetization free layer 30 has the xy component along the "first direction" at the position of the center G40 of the second magnetization free layer 40. That is, the magnetization of the first magnetization free layer 30 exerts magnetic force substantially parallel to or substantially anti-parallel to the "first direction" to the second magnetization free layer 40. As a result, the magnetization of the second magnetization free layer 40 has a component substantially parallel to or substantially anti-parallel to the "first direction".

Figure 2C:
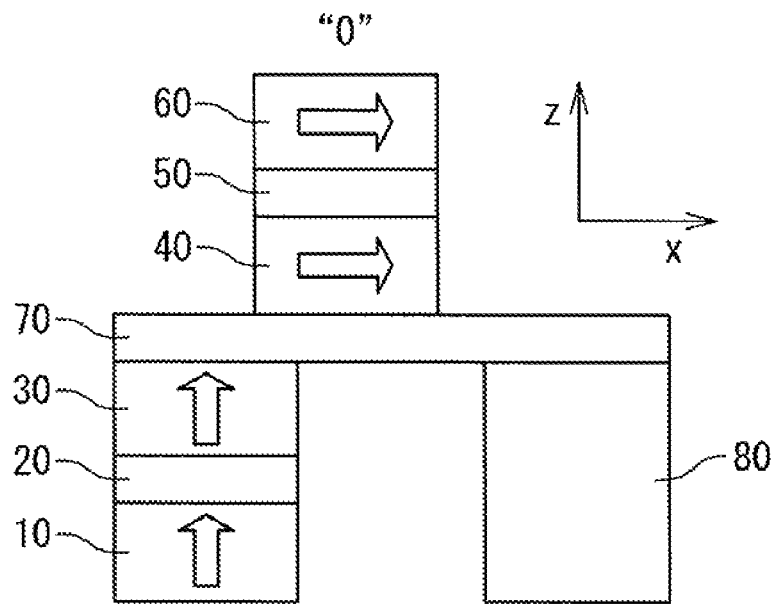
FIG. 2C is a x-z side view for explaining a memory state of the first magnetoresistance element.
Figure 2D:
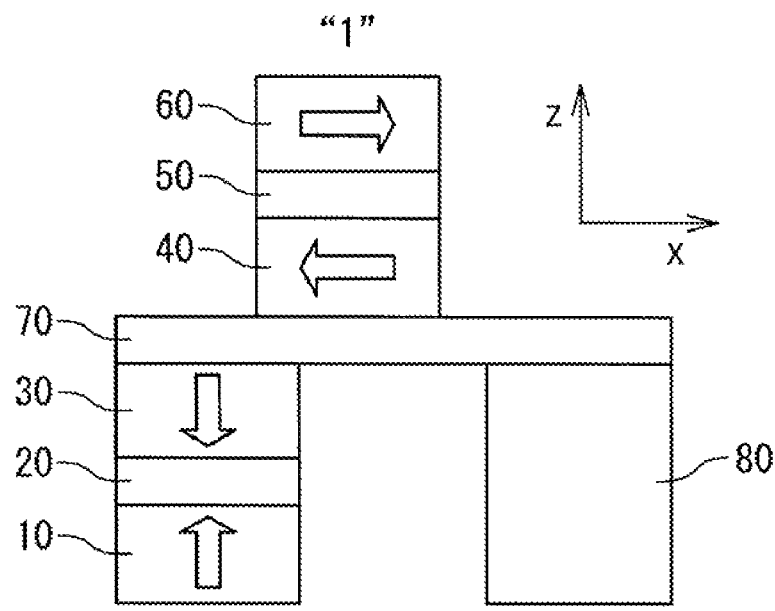
FIG. 2D is a x-z side view for explaining a memory state of the first magnetoresistance element.

FIG. 2C and FIG. 2D respectively exemplify two memory states that the first magnetoresistance element 1 can be in. In the example shown in FIG. 2C and FIG. 2D, the magnetization direction of the first magnetization fixed layer 10 is fixed in the +z-direction and the magnetization direction of the second magnetization fixed layer 60 is fixed in the +x-direction. One of or both of the magnetization directions may be opposite. Moreover, in the present example, the displacement direction (first direction) of the center G40 of the second magnetization free layer 40 with respect to the center G30 of the first magnetization free layer 30 is the +x-direction. The first direction also is arbitrary. However, it is desirable that the first direction is substantially parallel to or substantially anti-parallel to the magnetization direction of the second magnetization fixed layer 60.

In FIG. 2C, the magnetization of the first magnetization free layer 30 is directed to the +z-direction. In this case, the leakage magnetic field from the first magnetization free layer 30 has the +x component along the first direction at the position of the center G40 of the second magnetization free layer 40. As a result, the magnetization of the second magnetization free layer 40 has a component in the +x-direction due to the magnetic coupling between the first magnetization free layer 30 and the second magnetization free layer 40. In this case, the magnetization direction of the second magnetization free layer 40 has the component that is "parallel" to the magnetization direction of the second magnetization fixed layer 60, and thus a resistance value of the MTJ having the second magnetization free layer 40, the second spacer layer 50 and the second magnetization fixed layer 60 becomes comparatively low. The memory state shown in FIG. 2C is hereinafter referred to as "0" state.

In FIG. 2D, on the other hand, the magnetization of the first magnetization free layer 30 is directed to the −z-direction. In this case, the leakage magnetic field from the first magnetization free layer 30 has the −x component along the first direction at the position of the center G40 of the second magnetization free layer 40. As a result, the magnetization of the second magnetization free layer 40 has a component in the −x-direction due to the magnetic coupling between the first magnetization free layer 30 and the second magnetization free layer 40. In this case, the magnetization direction of the second magnetization free layer 40 has the component that is "anti-parallel" to the magnetization direction of the second magnetization fixed layer 60, and thus the resistance value of the MTJ having the second magnetization free layer 40, the second spacer layer 50 and the second magnetization fixed layer 60 becomes comparatively high. The memory state shown in FIG. 2D is hereinafter referred to as "1" state.

As exemplified above, due to the displacement of center and the magnetic coupling between the magnetization free layers 30 and 40, the magnetization direction of the second magnetization free layer 40 is "uniquely" determined depending on the magnetization direction of the first magnetization free layer 30. If the magnetization direction of the first magnetization free layer 30 is reversed, the magnetization direction of the second magnetization free layer 40 also is changed. As a result, difference in a relative angle of the magnetization direction between the second magnetization free layer 40 and the second magnetization fixed layer 60 is caused, which achieves the two memory states: the "0" state and the "1" state. That is, the two memory states are achieved corresponding to the magnetization directions of the first magnetization free layer 30.

It is preferable that the direction of the fixed magnetization of the second magnetization fixed layer 60 is substantially parallel to or substantially anti-parallel to the displacement direction (first direction) of the center between the first magnetization free layer 30 and the second magnetization free layer 40. The reason is that the variable magnetization of the second magnetization free layer 40 has the component substantially parallel to or substantially anti-parallel to the first direction depending on the magnetization direction of the first magnetization free layer 30. In the case where the direction of the fixed magnetization of the second magnetization fixed layer 60 is substantially parallel to or substantially anti-parallel to the first direction, change in the relative angle between the direction of the fixed magnetization and the direction of the variable magnetization of the second magnetization free layer 40 becomes remarkable. As a result, difference between the two memory states becomes conspicuous.

It can be said in the present exemplary embodiment that information stored in the first magnetization free layer 30 in a form of the magnetization component in the perpendicular direction is transmitted through the magnetic coupling to the magnetization component in the in-plane direction of the second magnetization free layer 40. A means for the magnetic coupling is not limited to the above-mentioned one utilizing the leakage magnetic field, as long as such the transmission of information is achieved. The first magnetization free layer 30 and the second magnetization free layer 40 can be magnetically related to each other by any magnetic coupling means such as exchange coupling-based one.

Moreover, the magnetization easy axis of the second magnetization free layer 40 can be along any direction, as long as the magnetization direction of the second magnetization free layer 40 can be changed depending on the magnetization direction of the first magnetization free layer 30. In the case of the magnetization easy axis along the x-axis direction as in the above-described example, the magnetization of the second magnetization free layer 40 is switched between directions along the magnetization easy axis. In a case of the magnetization easy axis along the y-axis direction, the magnetization of the second magnetization free layer 40 rotates toward the magnetization hard axis from the magnetization easy axis as a center. Moreover, the magnetic anisotropy of the second magnetization free layer 40 may be given by magneto-crystalline anisotropy or may be given by shape magnetic anisotropy.

1-3. Data Writing Method, Data Reading Method

Figure 3A:
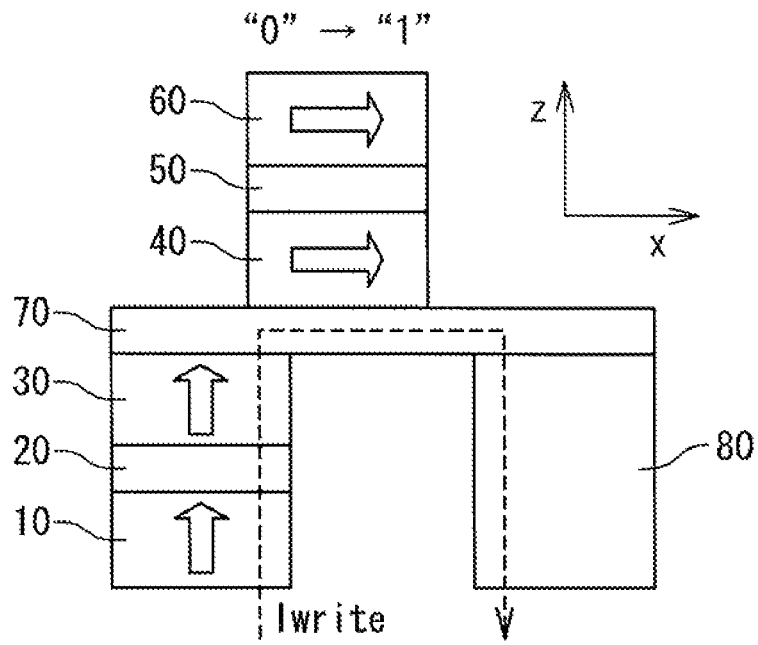
FIG. 3A is a conceptual diagram for explaining a method of writing a data to the first magnetoresistance element.
Figure 3B:
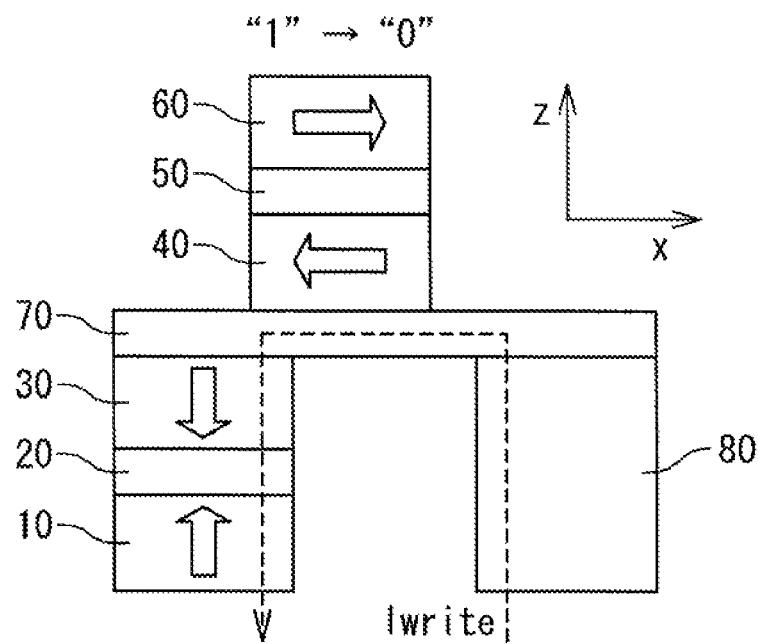
FIG. 3B is a conceptual diagram for explaining a method of writing a data to the first magnetoresistance element.

FIG. 3A and FIG. 3B are conceptual diagrams for explaining a method of writing data to the first magnetoresistance element 1. The data writing is achieved by the "spin transfer magnetization switching method". More specifically, the first magnetization fixed layer 10, the first spacer layer 20 and the first magnetization free layer 30 are used, and a write current Iwrite is supplied between the first magnetization fixed layer 10 and the first magnetization free layer 30.

FIG. 3A shows a path of the write current Iwrite at a time of transition from the "0" state (refer to FIG. 2C) to the "1" state (refer to FIG. 2D), namely "1" writing. Let us consider a case where the write current Iwrite is introduced in the arrow direction under the "0" state as shown in FIG. 3A. In this case, the write current Iwrite flows from the first magnetization fixed layer 10 through the first spacer layer 20 to the first magnetization free layer 30, and conduction electrons flow from the first magnetization free layer 30 through the first spacer layer 20 to the first magnetization fixed layer 10. In FIG. 3A, the magnetization direction of the first magnetization fixed layer 10 is fixed in the +z-direction, and thus more conduction electrons having the −z-direction spin angular momentum are reflected at the interface of the first magnetization fixed layer 10 as compared with conduction electrons having the +z-direction spin angular momentum. As a result, electrons having the −z-direction spin angular momentum become majority in the first magnetization free layer 30, and hence the magnetization switching to the −z-direction is induced. When the magnetization of the first magnetization free layer 30 is switched to the −z-direction, the magnetization of the second magnetization free layer 40 comes to have the −x-direction component due to the above-described magnetic coupling. That is to say, the "1" state shown in FIG. 2D is obtained.

On the other hand, FIG. 3B shows a path of the write current Iwrite at a time of transition from the "1" state (refer to FIG. 2D) to the "0" state (refer to FIG. 2C), namely "0" writing. Let us consider a case where the write current Iwrite is introduced in the arrow direction under the "1" state as shown in FIG. 3B. In this case, the write current Iwrite flows from the first magnetization free layer 30 through the first spacer layer 20 to the first magnetization fixed layer 10, and conduction electrons flow from the first magnetization fixed layer 10 through the first spacer layer 20 to the first magnetization free layer 30. In FIG. 3B, the magnetization direction of the first magnetization fixed layer 10 is fixed in the +z-direction, and thus lots of conduction electrons having the +z-direction spin angular momentum flow into the first magnetization free layer 30. As a result, electrons having the +z-direction spin angular momentum become majority in the first magnetization free layer 30, and hence the magnetization switching to the +z-direction is induced. When the magnetization of the first magnetization free layer 30 is switched to the +z-direction, the magnetization of the second magnetization free layer 40 comes to have the +x-direction component due to the above-described magnetic coupling. That is to say, the "0" state shown in FIG. 2C is obtained.

Figure 4A:
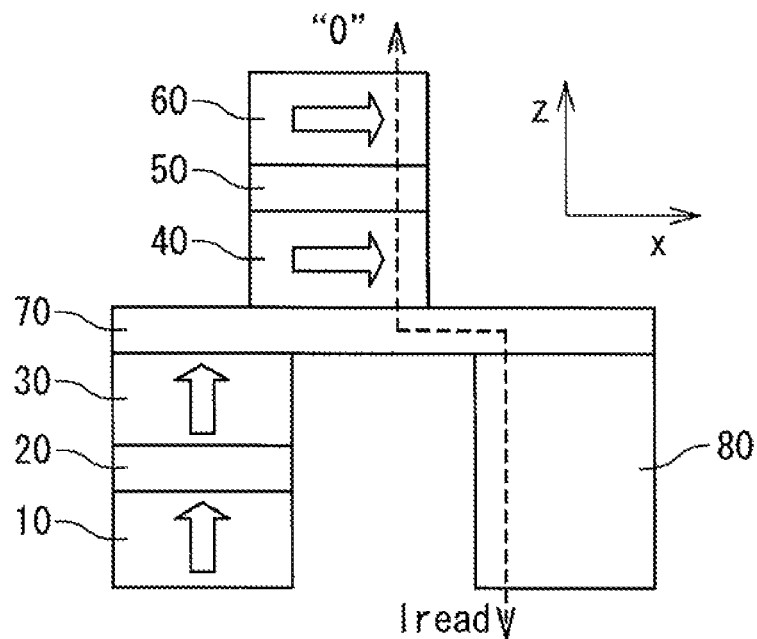
FIG. 4A is a conceptual diagram for explaining a method of reading a data from the first magnetoresistance element.
Figure 4B:
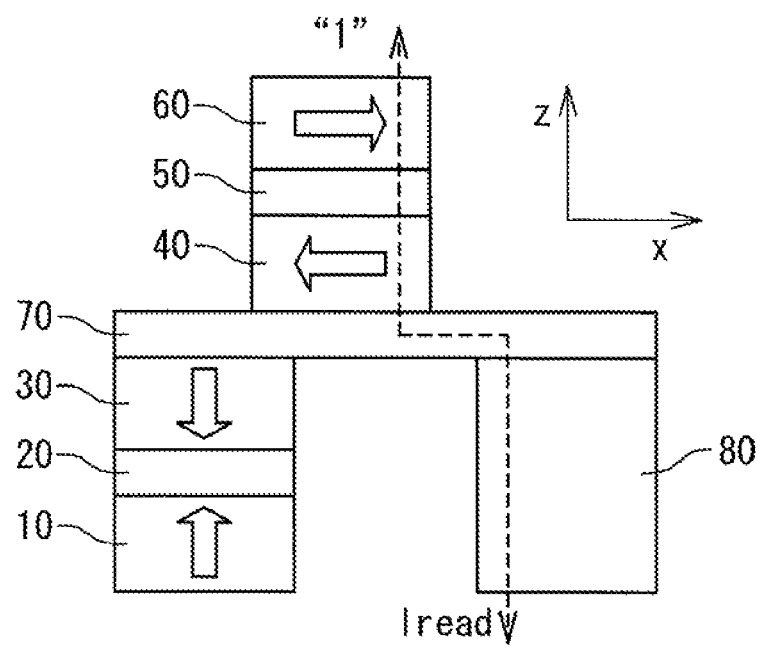
FIG. 4B is a conceptual diagram for explaining a method of reading a data from the first magnetoresistance element.

FIG. 4A and FIG. 4B are conceptual diagrams for explaining a method of reading data from the first magnetoresistance element 1. In the data reading, high and low of the resistance value due to the magnetoresistance effect is detected. To that end, the second magnetization free layer 40, the second spacer layer 50 and the second magnetization fixed layer 60 are used, and a read current Iread is supplied between the second magnetization free layer 40 and the second magnetization fixed layer 60.

FIG. 4A shows a case of the "0" state (refer to FIG. 2C). In this case, the resistance value of the magnetoresistance element is comparatively low. On the other hand, FIG. 4B shows a case of the "1" state (refer to FIG. 2D). In this case, the resistance value of the magnetoresistance element is comparatively high. That is, magnitude of the read current Iread or a read voltage corresponding to the read current Iread varies depending on whether the state is the "0" state or the "1" state. Therefore, whether it is the "0" state or the "1" state can be determined by comparing the read current Iread or the read voltage with a predetermined reference level.

In the first magnetoresistance element 1 according to the present exemplary embodiment, as described above, the first magnetization fixed layer 10, the first spacer layer 20 and the first magnetization free layer 30 are used at the time of the data writing. In this sense, the first magnetization fixed layer 10, the first spacer layer 20 and the first magnetization free layer 30 are referred to as a "write layer group". On the other hand, the second magnetization free layer 40, the second spacer layer 50 and the second magnetization fixed layer 60 are used at the time of the data reading. In this sense, the second magnetization free layer 40, the second spacer layer 50 and the second magnetization fixed layer 60 are referred to as a "read layer group".

According to the present exemplary embodiment, the write layer group and the read layer group are separately provided but are mutually related through the magnetic coupling. The information stored in the first magnetization free layer 30 of the write layer group is transmitted through the magnetic coupling to the second magnetization free layer 40 of the read layer group. To put it the other way around, the information transmission through the magnetic coupling makes it possible to provide the write layer group for use in the writing and the read layer group for use in the reading separately from each other. It is therefore possible to optimize the write layer group and the read layer group independently of each other such that desired characteristics are obtained respectively, which enables both improvement in the write characteristics and improvement in the read characteristics simultaneously. For example, a perpendicular magnetization film having appropriate material characteristics can be applied to the write layer group in order to reduce the write threshold current density, while an MTJ exhibiting a high MR ratio can be applied to the read layer group.

1-4. Material

The first magnetization fixed layer 10 and the first magnetization free layer 30 that are perpendicular magnetization films are formed of ferromagnetic material including at least one material selected from Fe, Co and Ni. Moreover, the perpendicular magnetic anisotropy can be stabilized by adding Pt, Pd and the like. In addition to that, the magnetic characteristics can be controlled by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au, Sm and the like. Concrete examples of the material include Co, Co—Pt, Co—Pd, Co—Cr, Co—Pt—Cr, Co—Cr—Ta, Co—Cr—B, Co—Cr—Pt—B, Co—Cr—Ta—B, Co—V, Co—Mo, Co—W, Co—Ti, Co—Ru, Co—Rh, Fe—Pt, Fe—Pd, Fe—Co—Pt, Fe—Co—Pd, Sm—Co, Gd—Fe—Co, Tb—Fe—Co and Gd—Tb—Fe—Co. Besides, the perpendicular magnetic anisotropy can be achieved also by stacking a layer including at least one material selected from Fe, Co and Ni and another layer. Concrete examples of the stacked film include Co/Pd, Co/Pt, Co/Ni and Fe/Au.

The second magnetization free layer 40 and the second magnetization fixed layer 60 that are in-plane magnetization films are formed of ferromagnetic material including at least one material selected from Fe, Co and Ni. In addition to that, the magnetic characteristics can be controlled by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au and the like. Concrete examples of the material include Ni—Fe, Co—Fe, Fe—Co—Ni, Ni—Fe—Zr, Co—Fe-B and Co—Fe—Zr—B.

As to the first spacer layer 20, various materials can be used. For example, conductor such as Al, Cr and Cu can be used. Alternatively, insulator such as Mg—O may be used. As shown in FIG. 3A and FIG. 3B, the first spacer layer 20 exists on the write current path. It is generally desirable that resistance of the write current path is low. From this point of view, low resistance material is preferable. Whereas, if the first spacer layer 20 has a filtering effect that preferentially allows passage of spin polarized electrons of one-polarity, the current density required for the writing can be reduced. From this point of view, Mg—O is preferable.

It is preferable that the second spacer layer 50 is formed of insulating material. Concrete examples of the material include Mg—O, Al—O, Al—N, Ni—O and Hf—O. It should be noted that semiconductor or metal can also be used as the material.

Since the second magnetization free layer 40, the second spacer layer 50 and the second magnetization fixed layer 60 exist on the read current path as shown in FIG. 4A and FIG. 4B, it is preferable that they are formed of material that can achieve a high MR ratio. For example, it has been recently reported that a giant MR ratio as large as 500% can be obtained in a Co—Fe—B/Mg—O/Co—Fe—B magnetic tunnel junction (MTJ) (refer to the Non-patent Document No. 1). From this point of view, it is preferable that the second spacer layer 50 includes Mg—O. Moreover, it is preferable that at least one of the second magnetization free layer 40 and the second magnetization fixed layer 60 includes Co—Fe—B.

Moreover, a stacked film (synthetic ferrimagnetic coupled layer) in which magnetizations are anti-parallel coupled can be applied to the magnetization fixed layer such as the first magnetization fixed layer 10 and the second magnetization fixed layer 60. In this case, the magnetization of the magnetization fixed layer can be fixed more strongly and influence of the leakage magnetic field on the outside can be reduced. Furthermore, the magnetization can be fixed more strongly by providing an anti-ferromagnetic layer adjacent to the magnetization fixed layer such as the first magnetization fixed layer 10 and the second magnetization fixed layer 60. Examples of material of the anti-ferromagnetic layer include Pt—Mn, Ir—Mn and Fe—Mn.

It is preferable that the first conductive layer 70 and the second conductive layer 80 are formed of low electric resistance material. The first conductive layer 70 sandwiched between the first magnetization free layer 30 and the second magnetization free layer 40 may be formed of magnetic material such as Fe, Co and Ni. In this case, the leakage magnetic flux from the first magnetization free layer 30 can be efficiently transmitted to the second magnetization free layer 40, which is preferable from a viewpoint of the above-mentioned magnetic coupling. From this point of view, it is preferable that the first conductive layer 70 is formed of high magnetic permeability material.

1-5. Technical Advantages

According to the present exemplary embodiment, it is possible to improve write characteristics, data retention characteristics and read characteristics independently of each other with respect to the MRAM based on the spin transfer magnetization switching method. This results from a fact that a portion contributing to the writing and memory data retention and a portion contributing to the reading are different from each other in the first magnetoresistance element 1 according to the present exemplary embodiment. As described in the Patent Document No. 1, it is possible to perform the spin transfer magnetization switching with the write threshold current density not more than 5 MA/cm2 by using a perpendicular magnetization film whose parameters are appropriately set. On the other hand, as described in the Non-patent Document No. 1, it is possible to obtain a MR ratio as high as 500% by using an MTJ having a certain stacked structure. According to the present exemplary embodiment, it is possible to reduce the write threshold current density by forming the first magnetization fixed layer 10 and the first magnetization free layer 30 responsible for the data writing/retention by using the perpendicular magnetization film. At the same time, it is possible to enhance the MR ratio and thus to increase the read-out signal by forming the second magnetization free layer 40 and the second magnetization fixed layer 60 responsible for the data reading by using the in-plane magnetization film.

Here, let us consider one MTJ that uses a perpendicular magnetization film in order to reduce the write threshold current density. To concurrently improve read characteristics of the same MTJ is considered to be difficult due to the following reason. As mentioned in the Patent Document No. 1, it is desirable for achieving reduction in the write threshold current density that the saturation magnetization of a recording layer (corresponding to the first magnetization free layer 30 in the present case) is moderately small. However, as the saturation magnetization becomes smaller, the spin polarization of the magnetic layer is generally lowered. When the spin polarization is lowered, the MR ratio contributing to the magnitude of the read-out signal becomes smaller. That is to say, the perpendicular magnetization film preferable for the reduction in the write threshold current density hardly achieves improvement in the read characteristics.

Whereas, let us consider one MTJ using an in-plane magnetization film (e.g. Co—Fe—B) that can achieve a high MR ratio. To sufficiently reduce the write threshold current density in the same MTJ is difficult. Moreover, when the element size is reduced, it becomes difficult to ensure thermal disturbance tolerance of retention data. According to the present exemplary embodiment, the data is retained by the first magnetization free layer 30 formed of the perpendicular magnetization film, which can ensure sufficient thermal disturbance tolerance. The reason is that the perpendicular magnetization film generally has sufficiently high magnetic anisotropy energy density (Ku).

1-6. First Modification Example

A first modification example relates to a positional relationship of the first magnetization free layer 30 and the second magnetization free layer 40 in the x-y plane. The positional relationship of the first magnetization free layer 30 and the second magnetization free layer 40 is not limited to the foregoing example. In the x-y plane, the center G40 of the second magnetization free layer 40 just needs to be located in the "first direction" from the center G30 of the first magnetization free layer 30.

Figure 5A:
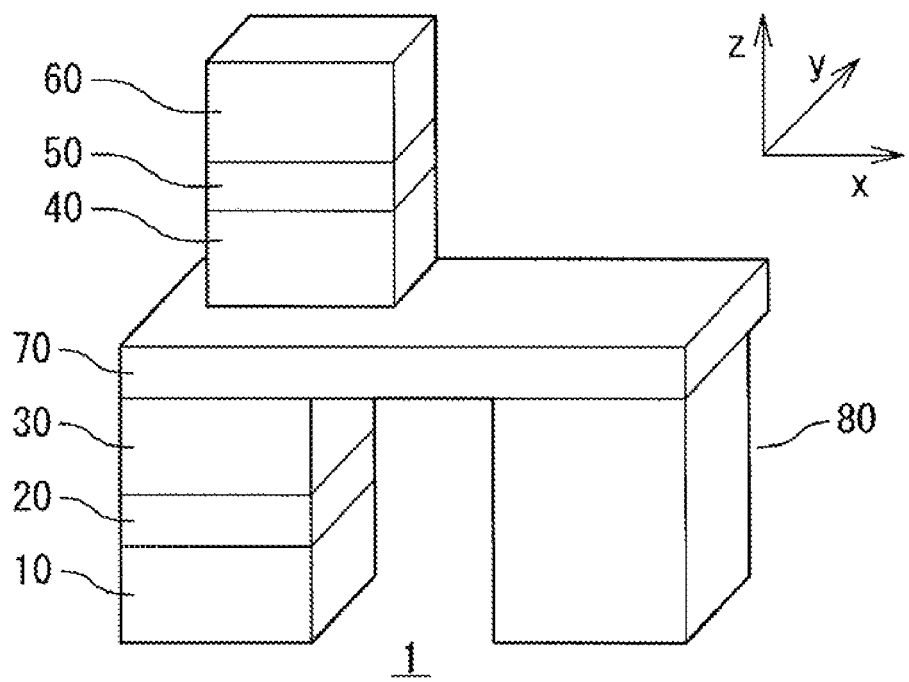
FIG. 5A is a perspective view showing a first modification example of the first magnetoresistance element.
Figure 5B:
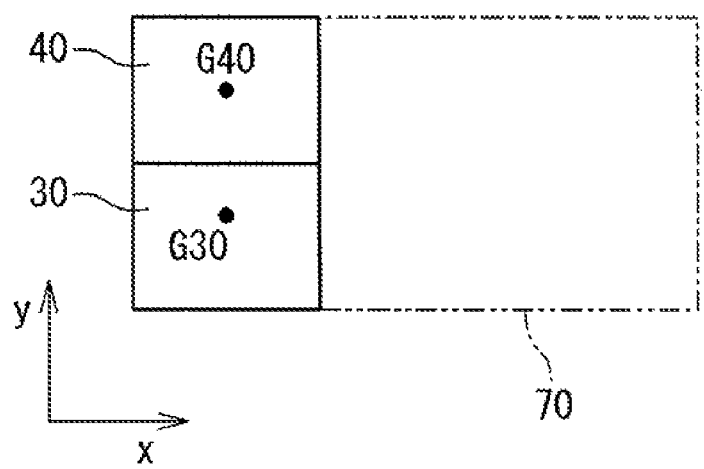
FIG. 5B is a x-y plan view of the structure shown in FIG. 5A.
Figure 5C:
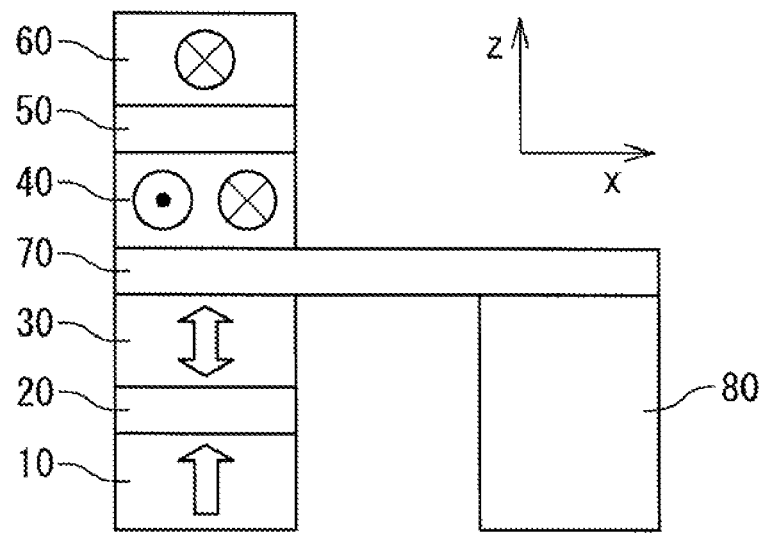
FIG. 5C is a x-z side view of the structure shown in FIG. 5A.
Figure 5D:
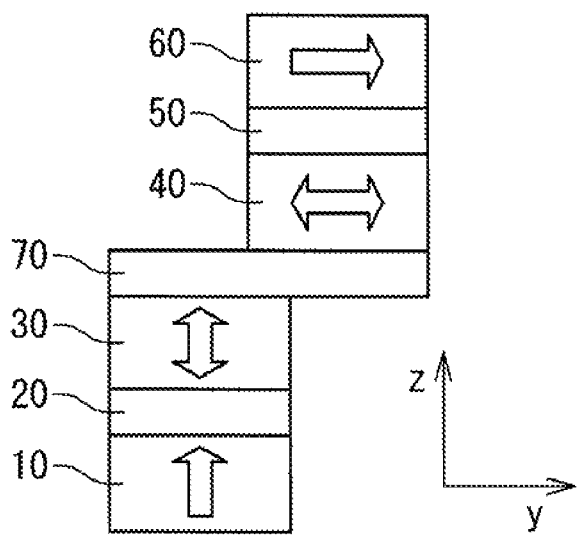
FIG. 5D is a y-z side view of the structure shown in FIG. 5A.

FIG. 5A is a perspective view showing an example of the structure of the first magnetoresistance element 1. FIGS. 5B, 5C and 5D respectively are a x-y plan view, a x-z side view and a y-z side view of the structure shown in FIG. 5A. In the example shown in FIGS. 5A to 5D, the displacement direction (first direction) between the first magnetization free layer 30 and the second magnetization free layer 40 is the y-axis direction. That is, in the x-y plane, the center G40 of the second magnetization free layer 40 is displaced in the y-axis direction from the center G30 of the first magnetization free layer 30. Therefore, the magnetization direction of the second magnetization free layer 40 is uniquely determined by the leakage magnetic field radiating outward from the first magnetization free layer 30. In this case, the magnetization direction of the second magnetization free layer 40 comes to have a component in the +y-direction or in the −y-direction depending on the magnetization direction of the first magnetization free layer 30. It is desirable that the magnetization direction of the second magnetization fixed layer 60 is fixed in any one of the +y-direction and the −y-direction.

1-7. Second Modification Example

A second modification example relates to a positional relationship of respective layers of the first magnetoresistance element 1 in the z-axis direction (stack direction). As described above, the first magnetization fixed layer 10, the first spacer layer 20 and the first magnetization free layer 30 form the "write layer group", and the second magnetization free layer 40, the second spacer layer 50 and the second magnetization fixed layer 60 form the "read layer group". Also, the first conductive layer 70 and the second conductive layer 80 form a "plug group" for introducing current to the write layer group and the read layer group. The positional relationship of the write layer group, the read layer group and the plug group is not limited to the foregoing example. The first magnetization free layer 30 of the write layer group and the second magnetization free layer 40 of the read layer group just need to be respectively formed in different layers and be magnetically coupled to each other.

Figure 6A:
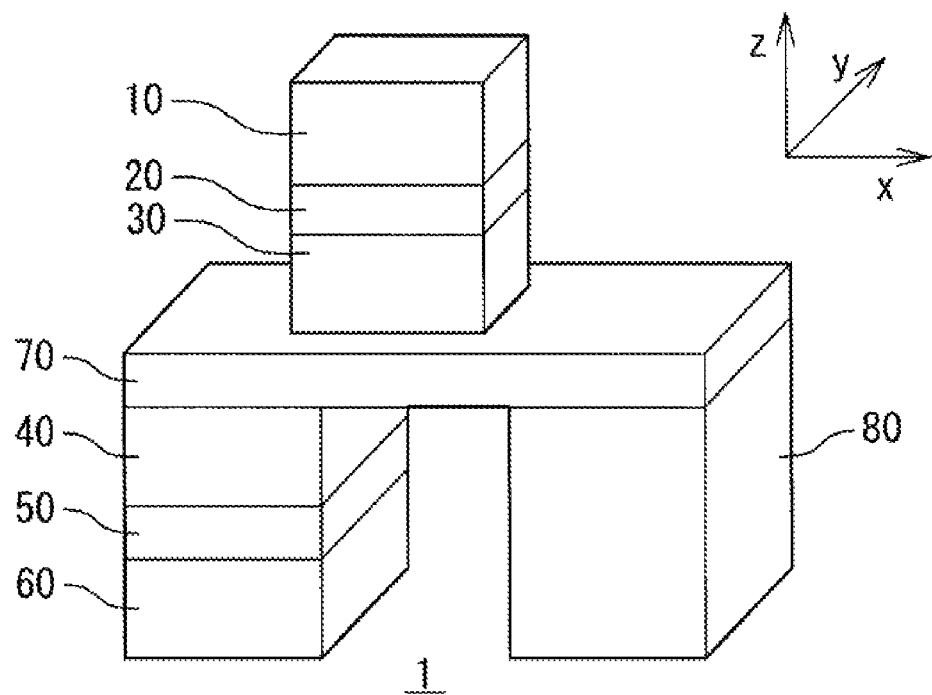
FIG. 6A is a perspective view showing a second modification example of the first magnetoresistance element.
Figure 6B:
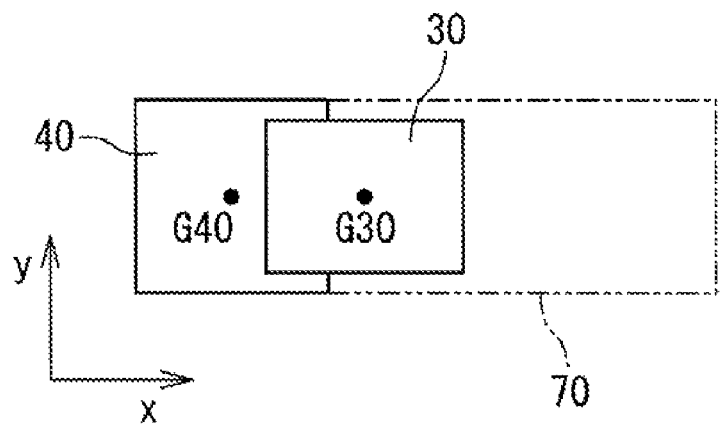
FIG. 6B is a x-y plan view of the structure shown in FIG. 6A.
Figure 6C:
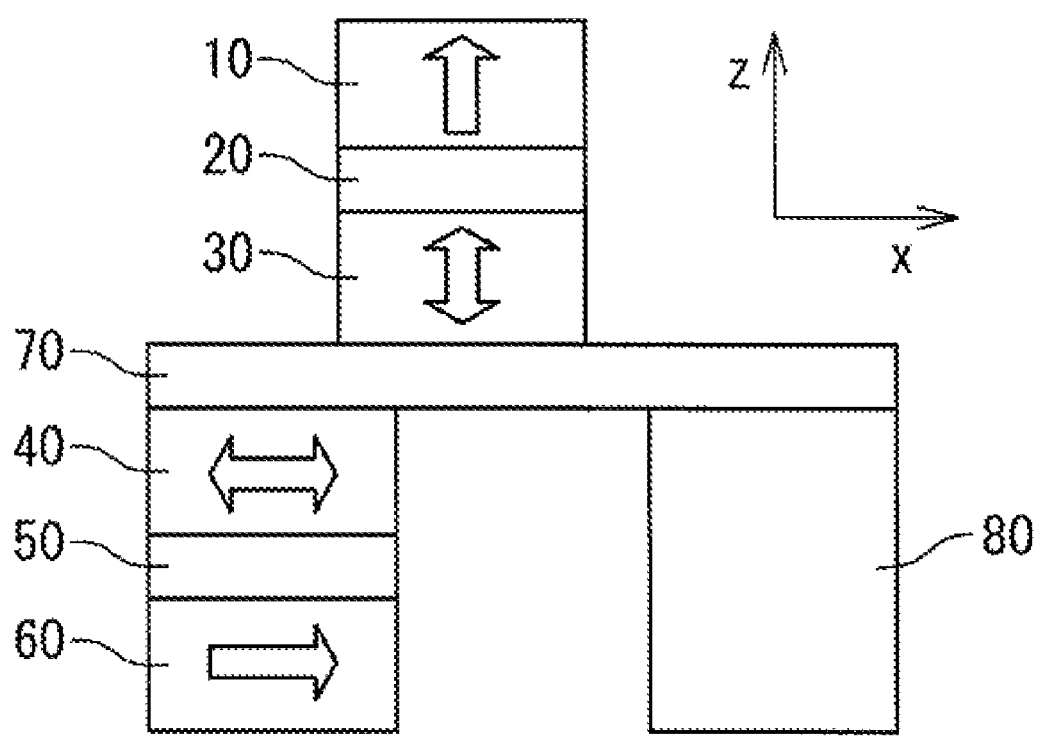
FIG. 6C is a x-z side view of the structure shown in FIG. 6A.

FIG. 6A is a perspective view showing an example of the first magnetoresistance element 1. FIG. 6B and FIG. 6C respectively are a x-y plan view and a x-z side view of the structure shown in FIG. 6A. In the example shown in FIGS. 6A to 6C, the write layer group is provided above the read layer group. The second conductive layer 80 is provided on the read layer group side (lower side) of the first conductive layer 70. In this case also, the first magnetization free layer 30 of the write layer group and the second magnetization free layer 40 of the read layer group are magnetically coupled to each other. Furthermore, the center G40 of the second magnetization free layer 40 is displaced from the center G30 of the first magnetization free layer 30 in the x-y plane. Therefore, the magnetization direction of the second magnetization free layer 40 is uniquely determined by the leakage magnetic field radiating outward from the first magnetization free layer 30.

Figure 7A:
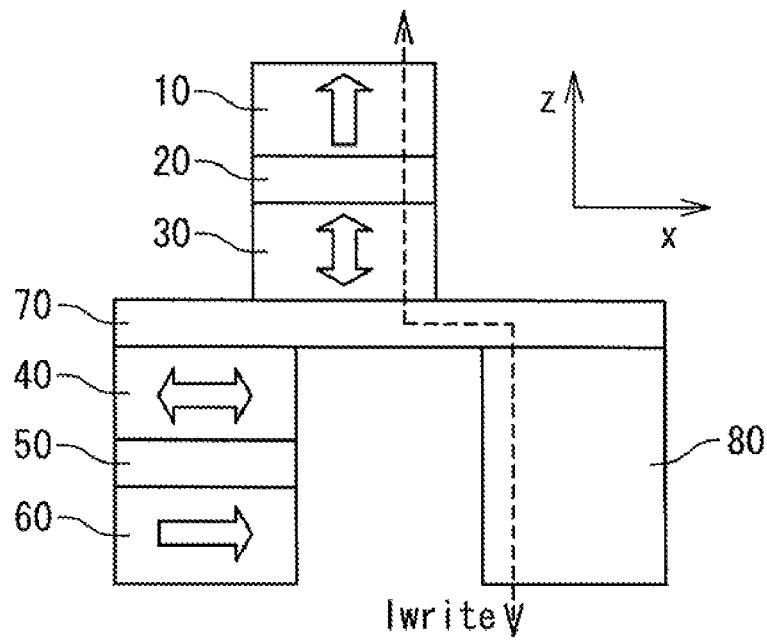
FIG. 7A is a conceptual diagram for explaining a method of writing a data to the first magnetoresistance element according to the second modification example.
Figure 7B:
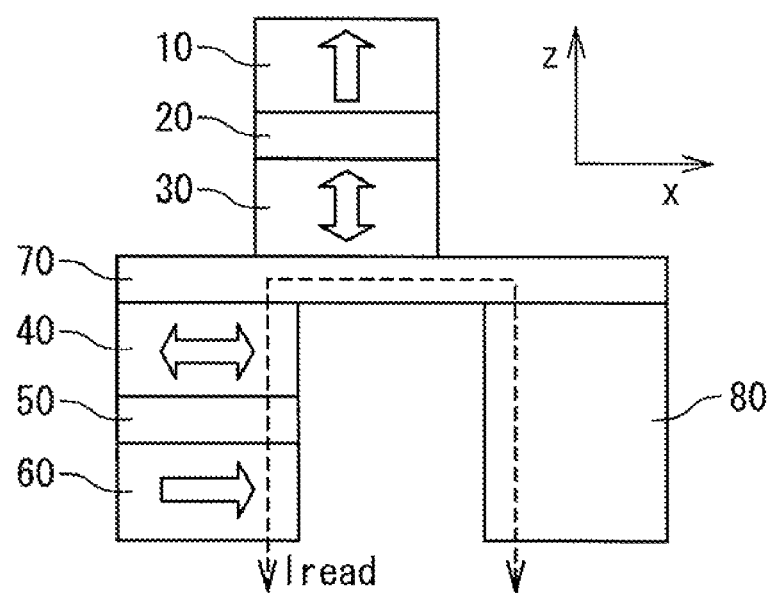
FIG. 7B is a conceptual diagram for explaining a method of reading a data from the first magnetoresistance element according to the second modification example.

FIG. 7A conceptually shows the write current Iwrite in the case of the example shown in FIGS. 6A to 6C. As in the case of the foregoing examples, the write current Iwrite flows from the plug group to the write layer group or from the write layer group to the plug group. Both, of the "0" writing and the "1" writing can be achieved by changing the direction of the write current Iwrite. FIG. 7B conceptually shows the read current Iread in the case of the example shown in FIGS. 6A to 6C. As in the case of the foregoing examples, the read current Iread is introduced to the read layer group by using the plug group.

Figure 8A:
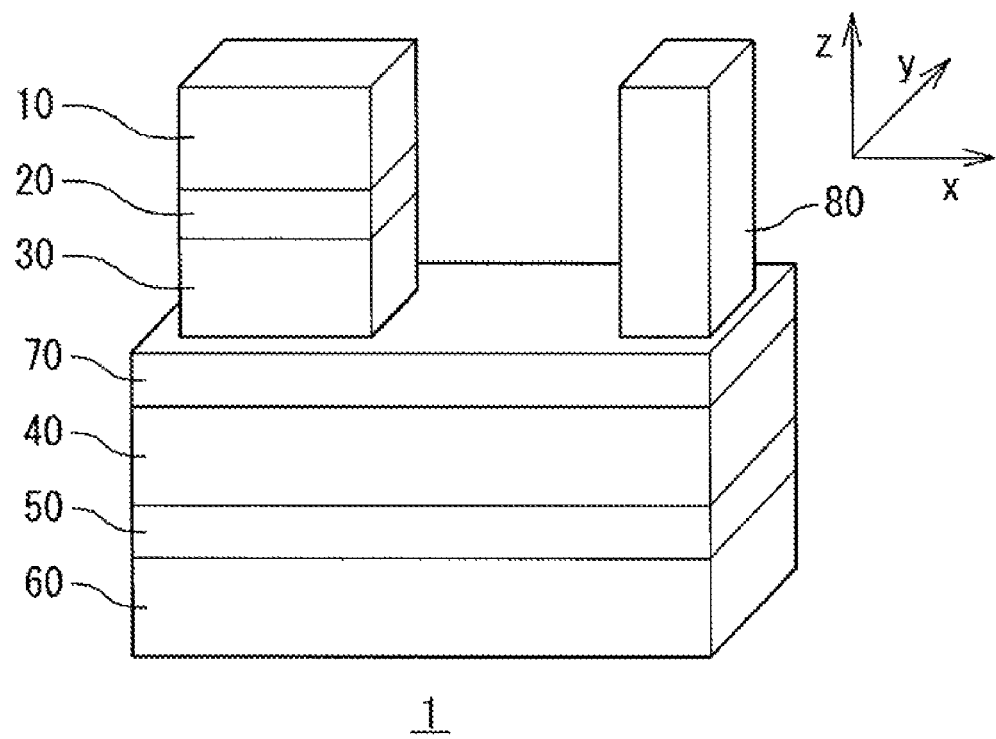
FIG. 8A is a perspective view showing another example of the first magnetoresistance element.
Figure 8B:
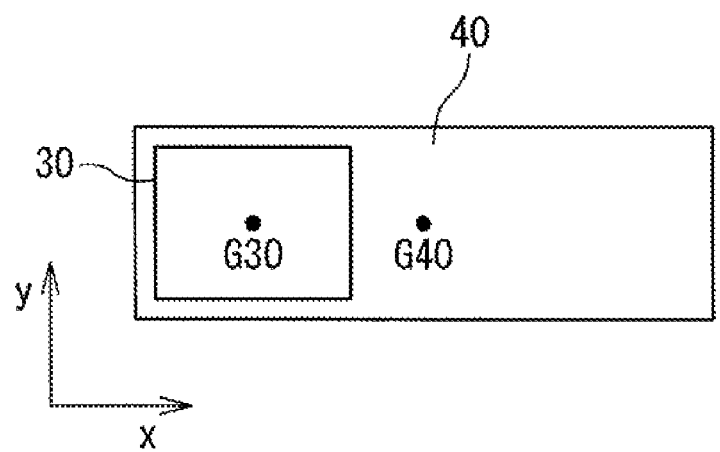
FIG. 8B is a x-y plan view of the structure shown in FIG. 8A.

FIG. 8A is a perspective view showing another example of the first magnetoresistance element 1. FIG. 8B and FIG. 8C respectively are a x-y plan view and a x-z side view of the structure shown in FIG. 8A. In the example shown in FIGS. 8A to 8C also, the write layer group is provided above the read layer group. Whereas, the second conductive layer 80 is provided on the write layer group side (upper side) of the first conductive layer 70.

1-8. Third Modification Example

In a third modification example, the first magnetoresistance element 1 is provided with a plurality of write layer groups. Each of the plurality of write layer groups has the above-described first magnetization fixed layer 10, first spacer layer 20 and first magnetization free layer 30.

Figure 9A:
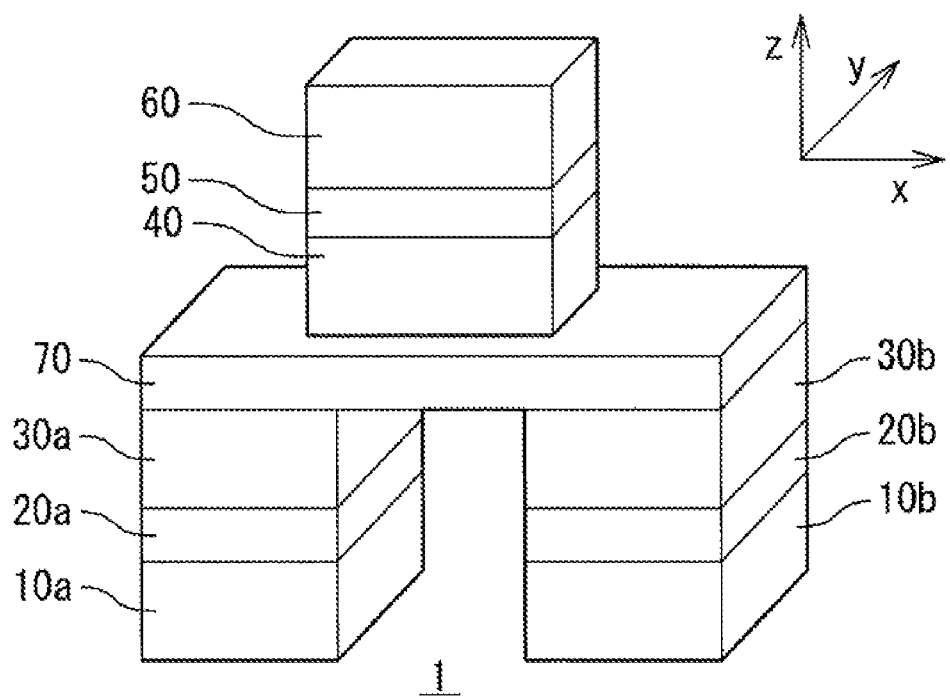
FIG. 9A is a perspective view showing a third modification example of the first magnetoresistance element.
Figure 9B:
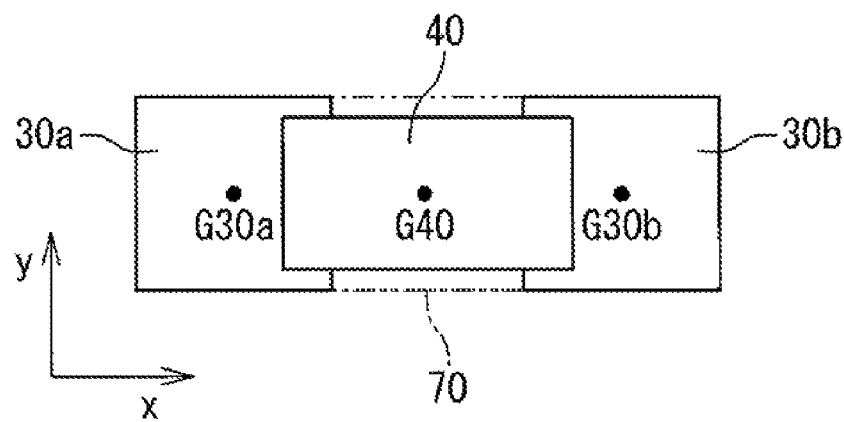
FIG. 9B is a x-y plan view of the structure shown in FIG. 9A.
Figure 9C:
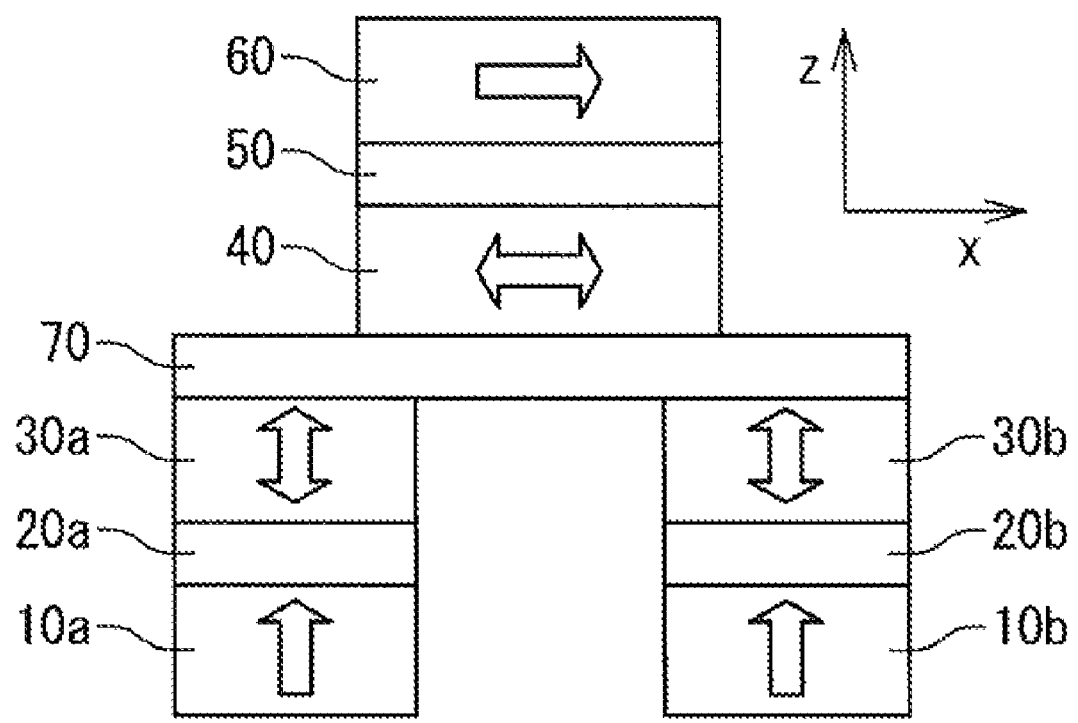
FIG. 9C is a x-z side view of the structure shown in FIG. 9A.

FIG. 9A is a perspective view showing an example of the first magnetoresistance element 1. FIG. 9B and FIG. 9C respectively are a x-y plan view and a x-z side view of the structure shown in FIG. 9A. In the example shown in FIGS. 9A to 9C, the first magnetoresistance element 1 has a first write layer group, a second write layer group, the first conductive layer 70 and the read layer group (40 to 60). The first write layer group has a first magnetization fixed layer 10a, a first spacer layer 20a and a first magnetization free layer 30a. The second write layer group has a first magnetization fixed layer 10b, a first spacer layer 20b and a first magnetization free layer 30b.

Preferably, the first magnetization fixed layer 10a and the first magnetization fixed layer 10b are formed in the same layer and have the same material, shape and film thickness. Also, the first spacer layer 20a and the first spacer layer 20b are formed in the same layer and have the same material, shape and film thickness. Also, the first magnetization free layer 30a and the first magnetization free layer 30b are formed in the same layer and have the same material, shape and film thickness. In the example shown in FIGS. 9A to 9C, the first magnetization free layer 30a and the first magnetization free layer 30b both are in contact with one surface of the first conductive layer 70, and the second magnetization free layer 40 is in contact with the other surface.

The first magnetization free layer 30a and the second magnetization free layer 40 are magnetically coupled to each other. Moreover, the center G40 of the second magnetization free layer 40 is displaced from the center G30a of the first magnetization free layer 30a in the x-y plane. Therefore, the magnetization of the first magnetization free layer 30a exerts magnetic force in the in-plane direction to the second magnetization free layer 40. Similarly, the first magnetization free layer 30b and the second magnetization free layer 40 are magnetically coupled to each other. Moreover, the center G40 of the second magnetization free layer 40 is displaced from the center G30b of the first magnetization free layer 30b in the x-y plane. Therefore, the magnetization of the first magnetization free layer 30b exerts magnetic force in the in-plane direction to the second magnetization free layer 40.

Preferably, the center G40 of the second magnetization free layer 40 is located between the center G30a of the first magnetization free layer 30a and the center G30b of the first magnetization free layer 30b in the x-y plane. It is particularly preferable that the center G30a of the first magnetization free layer 30a, the center G40 of the second magnetization free layer 40 and the center G30b of the first magnetization free layer 30b align in the x-y plane. In the example shown in FIGS. 9A to 9C, the center G40 of the second magnetization free layer 40 is displaced in the +x-direction from the center G30a of the first magnetization free layer 30a, and further the center G30b of the first magnetization free layer 30b is displaced in the +x-direction from the center G40 of the second magnetization free layer 40.

Figure 10A:
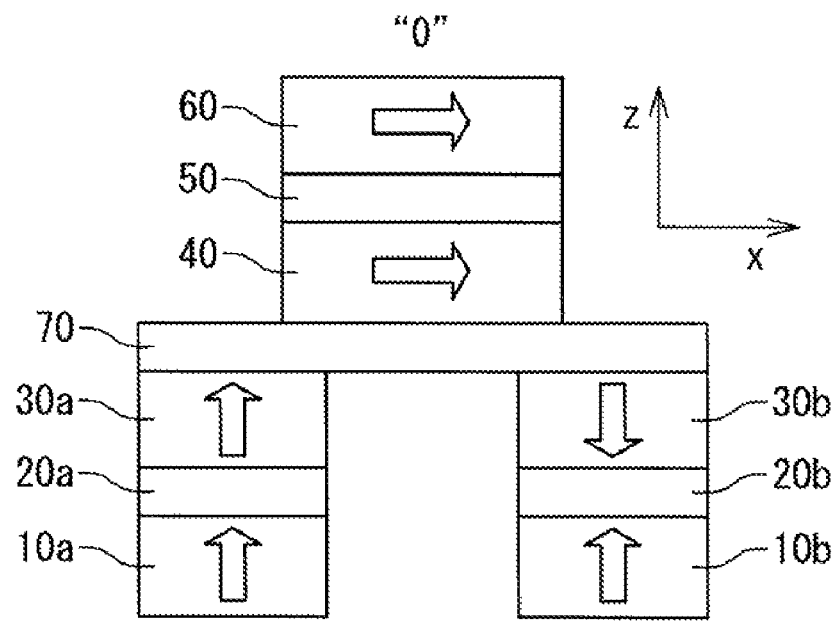
FIG. 10A is a x-z side view for explaining a memory state of the first magnetoresistance element according to the third modification example.
Figure 10B:
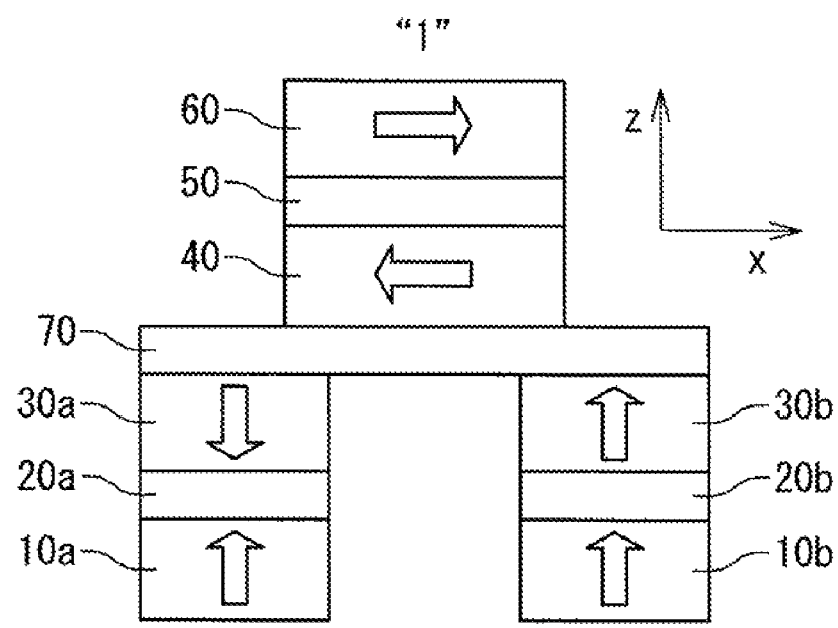
FIG. 10B is a x-z side view for explaining a memory state of the first magnetoresistance element according to the third modification example.

FIG. 10A and FIG. 10B respectively show two memory states of the first magnetoresistance element 1 shown in FIGS. 9A to 9C. In the example shown in FIG. 10A and FIG. 10B, the magnetization directions of the first magnetization fixed layers 10a and 10b are parallel to each other and are fixed in the same +z-direction. The magnetization direction of the second magnetization fixed layer 60 is fixed in the +x-direction.

In FIG. 10A, the magnetization of the first magnetization free layer 30a is directed to the +z-direction, while the magnetization of the first magnetization free layer 30b is directed to the −z-direction. That is, the magnetization directions of the first magnetization free layers 30a and 30b are substantially anti-parallel to each other. In this case, the leakage magnetic fields from the first magnetization free layers 30a and 30b both have the +x component at the position of the center G40 of the second magnetization free layer 40. The reason is that the center G40 of the second magnetization free layer 40 is located between the respective centers G30a and G30b of the first magnetization free layers 30a and 30b. In other words, since the center G40 is located between the centers G30a and G30b and the magnetization directions of the first magnetization free layers 30a and 30b are anti-parallel, the magnetic forces due to the first magnetization free layers 30a and 30b mutually strengthen each other at the position of the second magnetization free layer 40. The mutual magnetic force strengthening effect peaks when the centers G30a, G40 and G30b align, which is preferable. In this manner, the magnetization of the second magnetization free layer 40 has a component in the +x-direction due to the magnetic coupling between the first magnetization free layers 30a, 30b and the second magnetization free layer 40. In this case, the magnetization direction of the second magnetization free layer 40 has a component "parallel" to the magnetization direction of the second magnetization fixed layer 60 (the "0" state).

In FIG. 10B, on the other hand, the magnetization of the first magnetization free layer 30a is directed to the −z-direction, while the magnetization of the first magnetization free layer 30b is directed to the +z-direction. In this case, the leakage magnetic fields from the first magnetization free layers 30a and 30b both have the −x component at the position of the center G40 of the second magnetization free layer 40. As a result, the magnetization of the second magnetization free layer 40 has a component in the −x-direction. In this case, the magnetization direction of the second magnetization free layer 40 has a component "anti-parallel" to the magnetization direction of the second magnetization fixed layer 60 (the "1" state).

When the magnetization direction of one of the first magnetization free layers 30a and 30b is switched, the magnetization direction of the other thereof needs to be switched simultaneously. To that end, at the time of data writing, the write current Iwrite is supplied between the first magnetization fixed layer 10 and the first magnetization free layer 30 in each of the write layer groups. The directions of the write current Iwrite in the respective write layer groups are designed as appropriate such that the magnetizations of the respective first magnetization free layers 30 are switched.

Figure 11A:
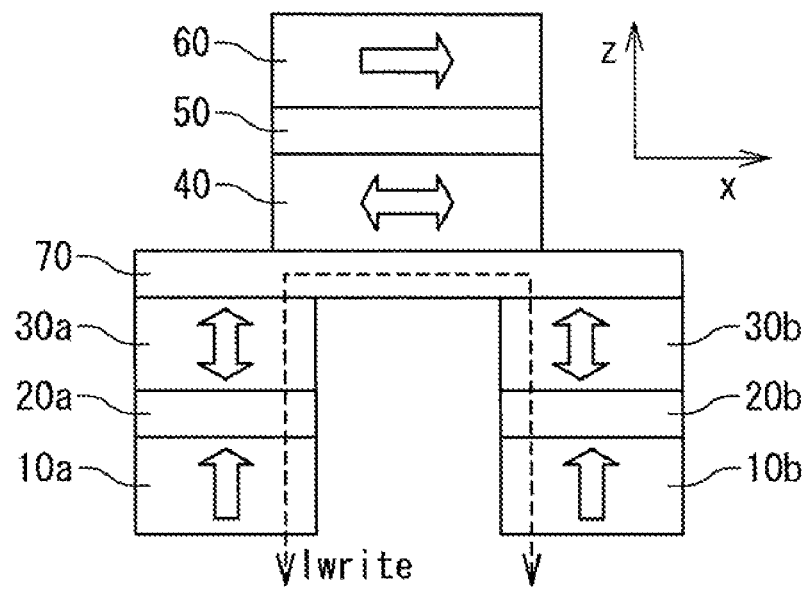
FIG. 11A is a conceptual diagram for explaining a method of writing a data to the first magnetoresistance element according to the third modification example.

FIG. 11A shows an example of the write current Iwrite in the third modification example. As described above, the magnetization directions of the first magnetization fixed layers 10a and 10b are parallel to each other, and the magnetization directions of the first magnetization free layers 30a and 30b are anti-parallel to each other. Therefore, the direction of the write current Iwrite flowing between the first magnetization fixed layer 10a and the first magnetization free layer 30a of the first write layer group is designed opposite to the direction of the write current Iwrite flowing between the first magnetization fixed layer 10b and the first magnetization free layer 30b of the second write layer group. As a result, the anti-parallel magnetizations of the first magnetization free layers 30a and 30b both are switched. In the example shown in FIG. 11A, the write current Iwrite is supplied between the first write layer group and the second write layer group through the first conductive layer 70, and both of the "0" writing and the "1" writing can be achieved by switching the direction of the write current Iwrite.

Figure 11B:
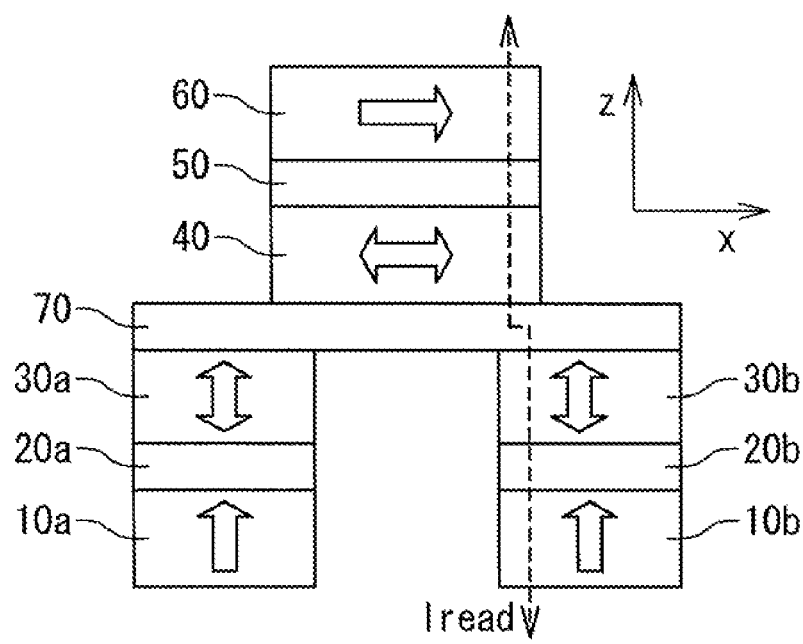
FIG. 11B is a conceptual diagram for explaining a method of reading a data from the first magnetoresistance element according to the third modification example.

At the time of data reading, the read current Iread is supplied between the second magnetization free layer 40 and the second magnetization fixed layer 60 of the read layer group. FIG. 11B shows an example of a method of introducing the read current Iread. In the example shown in FIG. 11B, the read current Iread is introduced through the second write layer group. The read current Iread may be supplied through the first write layer group or through both of the first write layer group and the second write layer group.

According to the third modification example, the following effects can be obtained additionally. First, the read-out signal is further enhanced. In the present modification example, two or more first magnetization free layers 30 which are sources of the leakage magnetic field contributing to rotation of the magnetization of the second magnetization free layer 40 are provided. Therefore, the magnitude of the magnetic field acting on the second magnetization free layer 40 becomes twice or more, resulting in larger rotation of the magnetization of the second magnetization free layer 40. Consequently, the magnetoresistance effect becomes more remarkable, and thus a large read-out signal can be obtained.

Moreover, manufacturing processes are simplified. In the case of the structure shown in the foregoing FIGS. 1A to 1C, for example, the write layer group (10 to 30) and the second conductive layer 80 are arranged in the same layer and need to be manufactured by separate processes. According to the present modification example, on the other hand, the first write layer group and the second write layer group can be manufactured by the same process. Therefore, the number of manufacturing processes is reduced and the manufacturing costs are reduced.

1-9. Fourth Modification Example

Figure 12A:
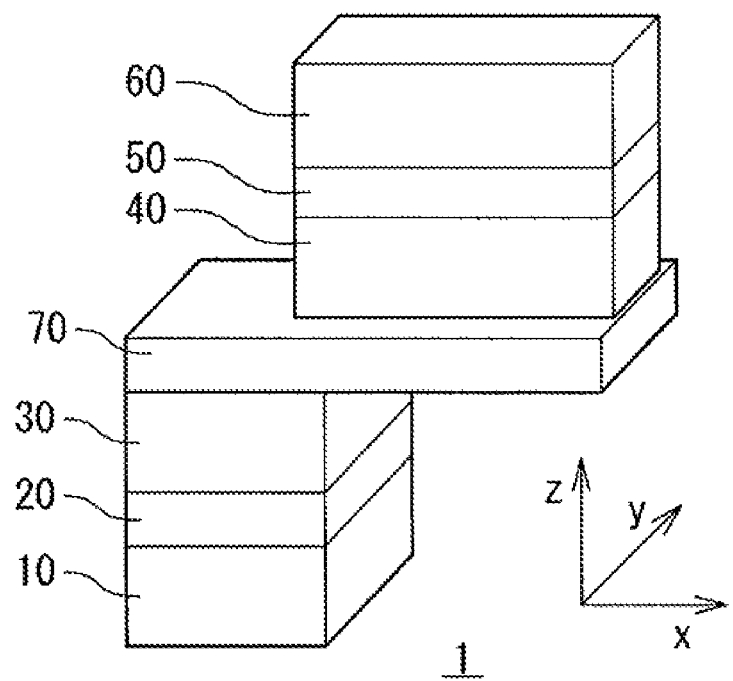
FIG. 12A is a perspective view showing a fourth modification example of the first magnetoresistance element.
Figure 12B:
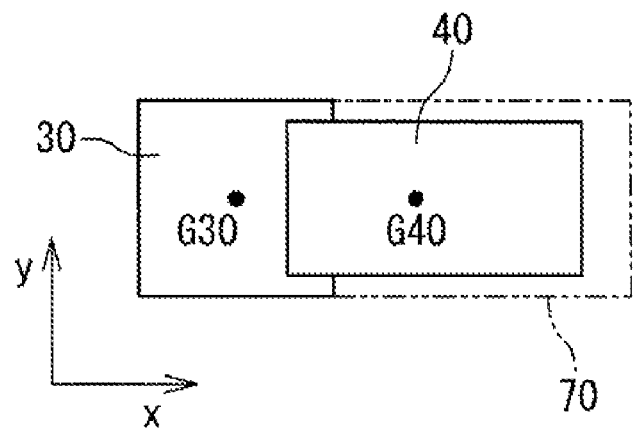
FIG. 12B is a x-y plan view of the structure shown in FIG. 12A.
Figure 12C:
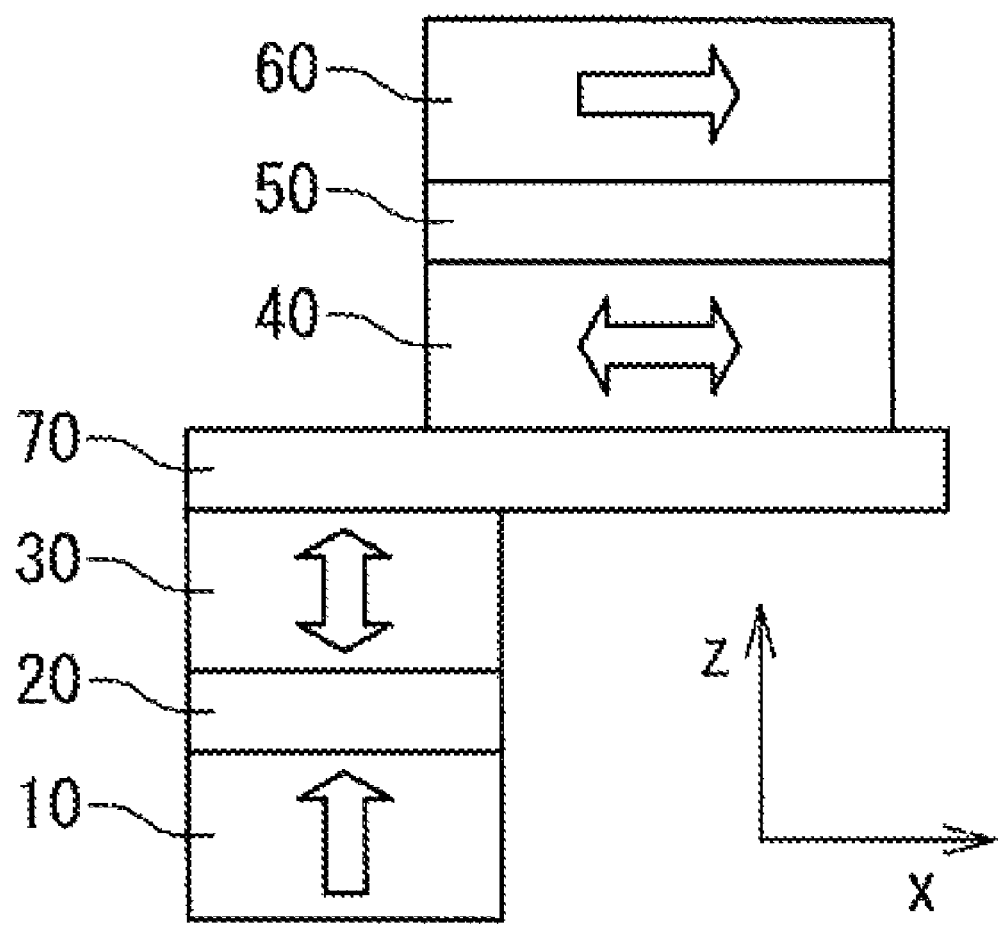
FIG. 12C is a x-z side view of the structure shown in FIG. 12A.

In a fourth modification example, the second conductive layer 80 is omitted. FIG. 12A is a perspective view showing an example of the first magnetoresistance element 1. FIG. 12B and FIG. 12C respectively are a x-y plan view and a x-z side view of the structure shown in FIG. 12A. As shown in FIGS. 12A to 12C, the second conductive layer 80 is omitted, and the first magnetoresistance element 1 is a two-terminal element. In this case also, the first magnetization free layer 30 and the second magnetization free layer 40 are magnetically coupled to each other, and the center G40 of the second magnetization free layer 40 is displaced from the center G30 of the first magnetization free layer 30. Therefore, the magnetization direction of the second magnetization free layer 40 is uniquely determined depending on the magnetization direction of the first magnetization free layer 30.

Figure 13A:
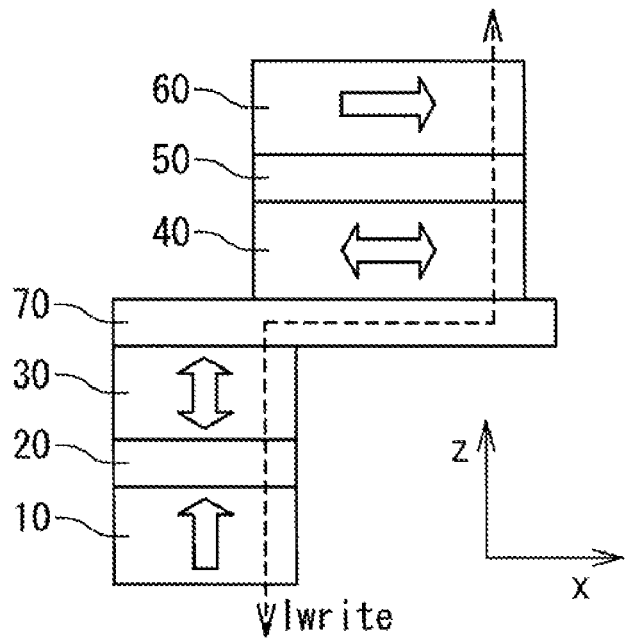
FIG. 13A is a conceptual diagram for explaining a method of writing a data to the first magnetoresistance element according to the fourth modification example.
Figure 13B:
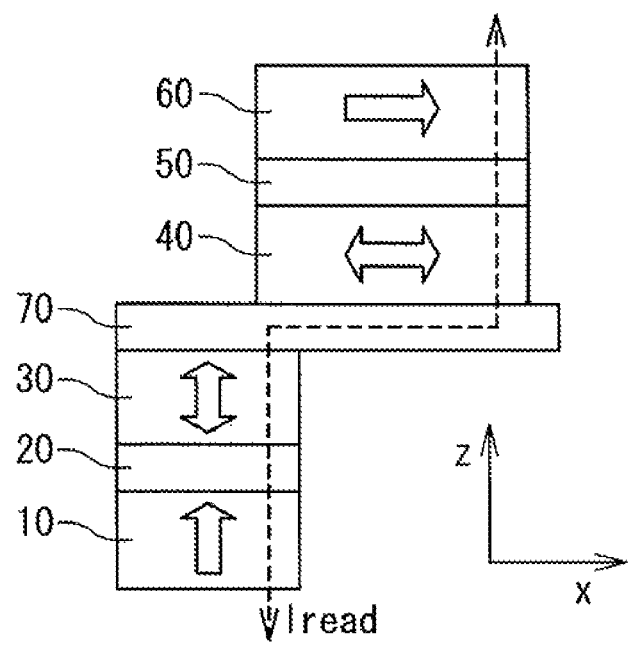
FIG. 13B is a conceptual diagram for explaining a method of reading a data from the first magnetoresistance element according to the fourth modification example.

FIG. 13A and FIG. 13B respectively show paths of the write current Iwrite and the read current Iread in the present modification example. Since the first magnetoresistance element 1 according to the present modification example is a two-terminal element, the write current Iwrite introduced to the write layer group at the time of data writing flows in the read layer group as well. Similarly, the read current Iread introduced to the read layer group at the time of data reading flows in the write layer group as well. That is to say, the path of the write current Iwrite and the path of the read current Iread are the same.

It is therefore necessary to prevent at the time of data reading that the spin transfer magnetization switching is caused by the read current Iread in the first magnetization free layer 30. To that end, the read current Iread is set to small. Moreover, it is necessary to prevent at the time of data writing that the spin transfer magnetization switching is caused by the write current Iwrite in the second magnetization free layer 40. To that end, it is preferable that the current density of the write current Iwrite flowing in the read layer group (40, 50, 60) is lower than the current density of the write current Iwrite flowing in the write layer group (10, 20, 30). For example, an area of the read layer group in the x-y plane is designed to be larger than an area of the write layer group in the x-y plane.

According to the fourth modification example, the first magnetoresistance element 1 is the two-terminal element, and thus the structure becomes simplified and the cell area can be reduced.

It should be noted that the examples described above can be combined as long as no contradiction arises.

2. Variation in Reference Level

Figure 14:
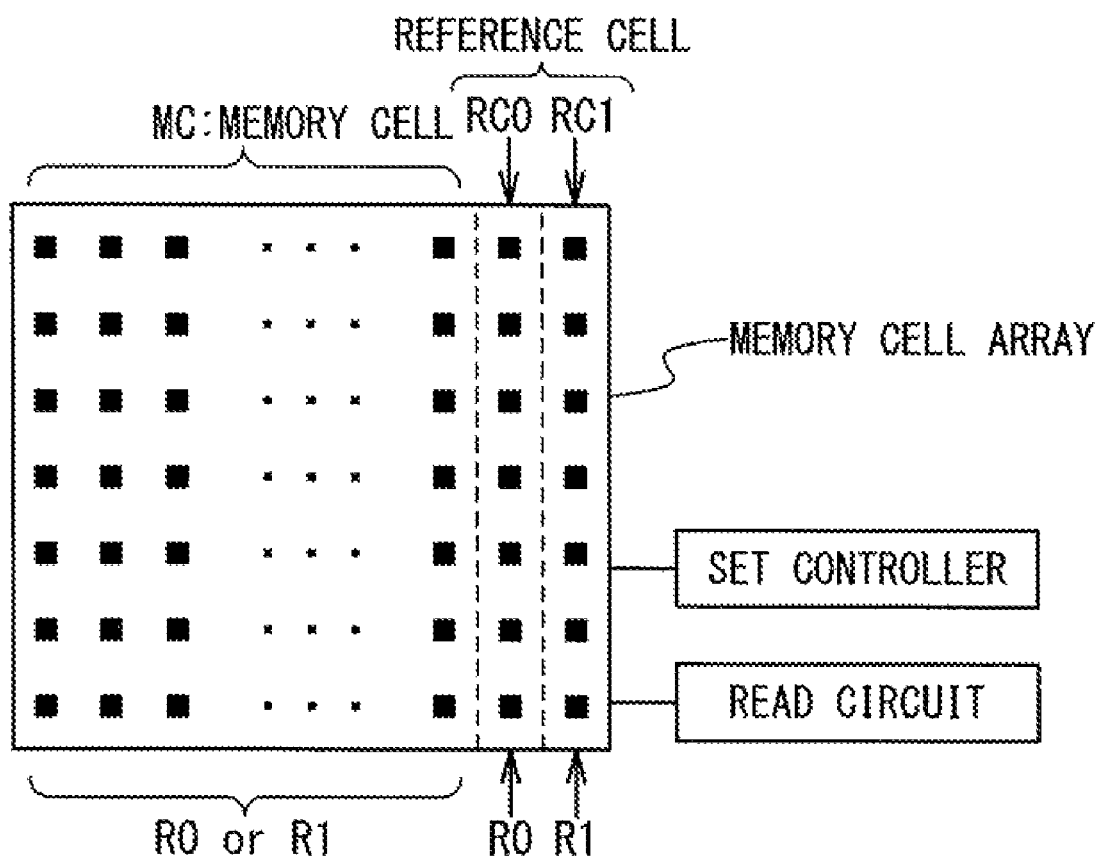
FIG. 14 is a schematic view showing a configuration of a typical MRAM.

FIG. 14 schematically shows a configuration of a typical MRAM. A memory cell array of the MRAM has a plurality of cells that are arranged in a matrix form. More specifically, the cells include memory cells MC used for storing data and reference cells RC0 and RC1 that are referred to for generating a reference level at the time of data reading. The memory cell MC and the reference cells RC0 and RC1 have the same structured magnetoresistance element.

A data "0" or a data "1" is stored in the memory cell MC. A resistance value of the magnetoresistance element of the memory cell MC is R0 in the case of the data "0" and R1 in the case of the data "1". The reference cell RC0 is set to the data "0" and the resistance value of the magnetoresistance element thereof is R0. On the other hand, the reference cell RC1 is set to the data "1" and the resistance value of the magnetoresistance element is R1. Such setting of the reference cells RC0 and RC1 is performed in the same manner as the data writing to the memory cell MC, and a set controller dedicated to that procedure is provided.

At the time of data reading, the read current is supplied to the reference cells RC0 and RC1 in addition to a read-target memory cell MC. Based on the read current flowing in the memory cell MC, a read circuit generates a read-out level depending on the memory data of the memory cell MC. Moreover, based on the read currents flowing in the respective reference cells RC0 and RC1, the read circuit generates a reference level corresponding to an intermediate resistance value of the resistance values R0 and R1. Then, the read circuit compares the read-out level with the reference level to determine the memory data of the memory cell MC.

Here, let us consider a case where the above-described first magnetoresistance element 1 is applied to the memory cell MC and the reference cells RC0 and RC1. In the first magnetoresistance element 1, as described above, the write layer group (10 to 30) and the read layer group (40 to 60) are separated from each other in order to improve the write characteristics and the read characteristics independently of each other. The magnetization state of the second magnetization free layer 40 of the read layer group, namely, the MTJ resistance value of the read layer group is remotely determined depending on the magnetization state of the first magnetization free layer 30.

In the case of this structure, there is a possibility that the MTJ resistance value (R0 or R1) of the read layer group varies even between the memory cells MC in which the same data is stored. The same applies to the reference cells RC0 and RC1. The resistance value R0 of the read layer group may vary between the reference cells RC0 that are set to the data "0", and the resistance value R1 of the read layer group may vary between the reference cells RC1 that set to the data "1". In the case where the reference level is generated by referring to the two kinds of reference cells RC0 and RC1 as described above, increase in the variation in the resistance values of the respective reference cells RC0 and RC1 causes increase in variation in the reference level. The variation in the reference level means an uncertain reference level, which increases probability of erroneous data reading.

An example of the variation in the reference level will be described below with reference to FIGS. 15 to 18.

Figure 15:
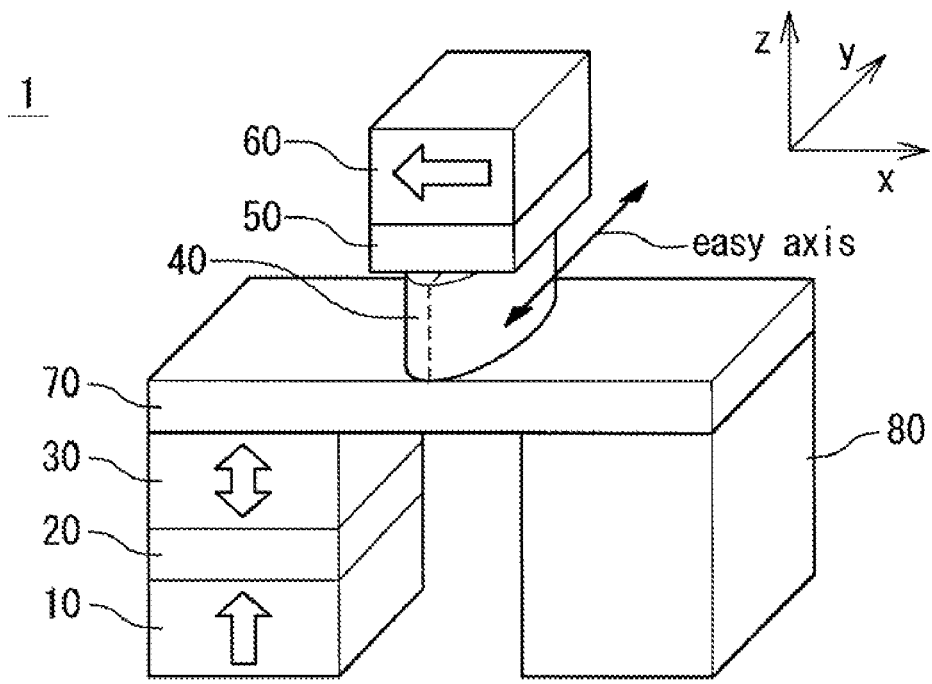
FIG. 15 is a perspective view showing an example of the first magnetoresistance element according to the exemplary embodiment of the present invention.
Figure 16:
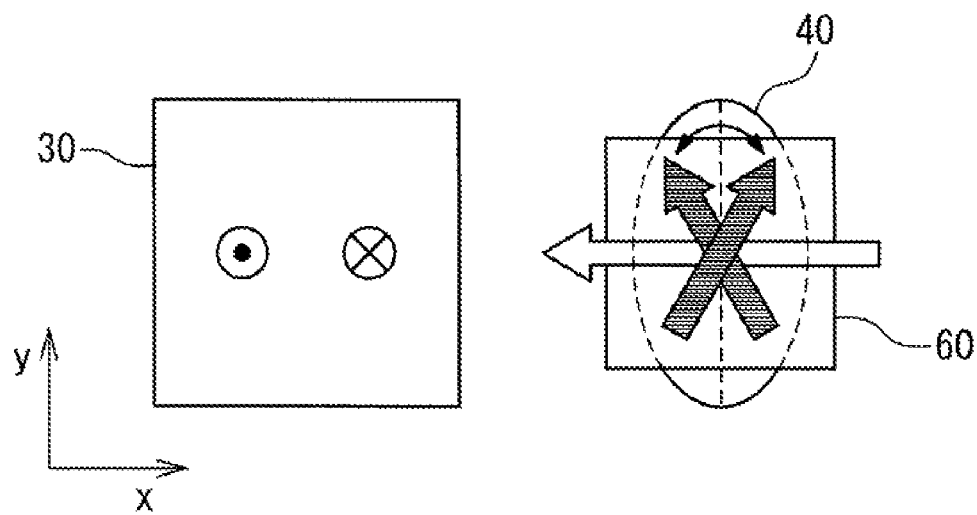
FIG. 16 is a plan view showing magnetization state of the first magnetoresistance element shown in FIG. 15.

FIG. 15 is a perspective view showing an example of the first magnetoresistance element 1, and FIG. 16 is a plan view showing magnetization state of the first magnetoresistance element 1 shown in FIG. 15. In the example shown in FIG. 15 and FIG. 16, the displacement direction (first direction) of the second magnetization free layer 40 with respect to the first magnetization free layer 30 is the x-direction and the magnetization easy axis of the second magnetization free layer 40 is along the y-direction perpendicular to the x-direction. In this case, the perpendicular magnetization of the first magnetization free layer 30 applies a magnetization component in the +x-direction or in the −x-direction to the second magnetization free layer 40 and, as shown in FIG. 16, the magnetization of the second magnetization free layer 40 rotates toward the magnetization hard axis (x-axis) direction from the magnetization easy axis (y-axis) as a center. Meanwhile, the magnetization direction of the second magnetization fixed layer 60 is fixed parallel to or anti-parallel to the first direction and is perpendicular to the magnetization easy axis of the second magnetization free layer 40. As a result, difference in a relative angle of the magnetization direction between the second magnetization free layer 40 and the second magnetization fixed layer 60 is caused, which achieves the two memory states: the data "0" and the data "1".

Figure 17:
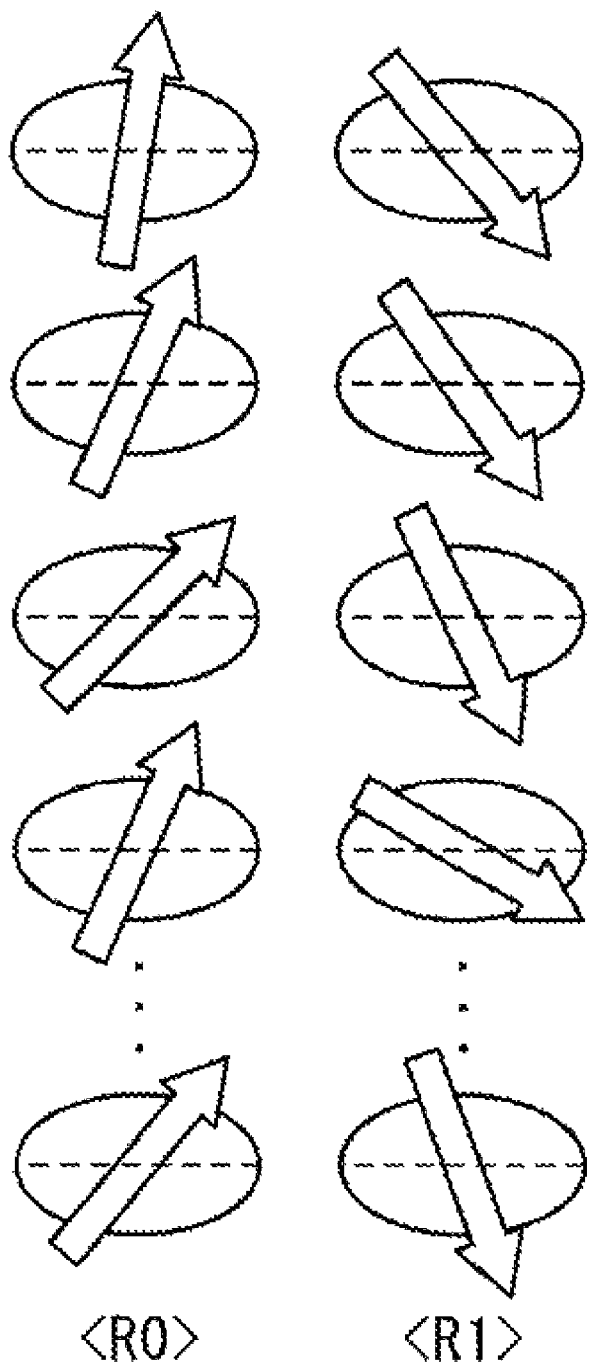
FIG. 17 is a conceptual diagram showing variation in the magnetization state.

In the case where the first magnetoresistance element 1 shown in FIGS. 15 and 16 is applied to the memory cell MC and the reference cells RC0 and RC1, variation in the magnetization state of the second magnetization free layer 40 of the read layer group is caused as shown in FIG. 17. That is, in a cell having comparatively large magnetic anisotropy of the second magnetization free layer 40, the rotation amount of the magnetization with respect to the magnetization easy axis becomes small. Conversely, in a cell having comparatively small magnetic anisotropy of the second magnetization free layer 40, the rotation amount of the magnetization with respect to the magnetization easy axis becomes large. Such a variation in the rotation amount of the magnetization means variation in the MTJ resistance value (R0 or R1) of the read layer group. That is to say, the resistance value R0 varies between the reference cells RC0 that are set to the data "0", and the resistance value R1 varies between the reference cells RC1 that are set to the data "1".

Figure 18:
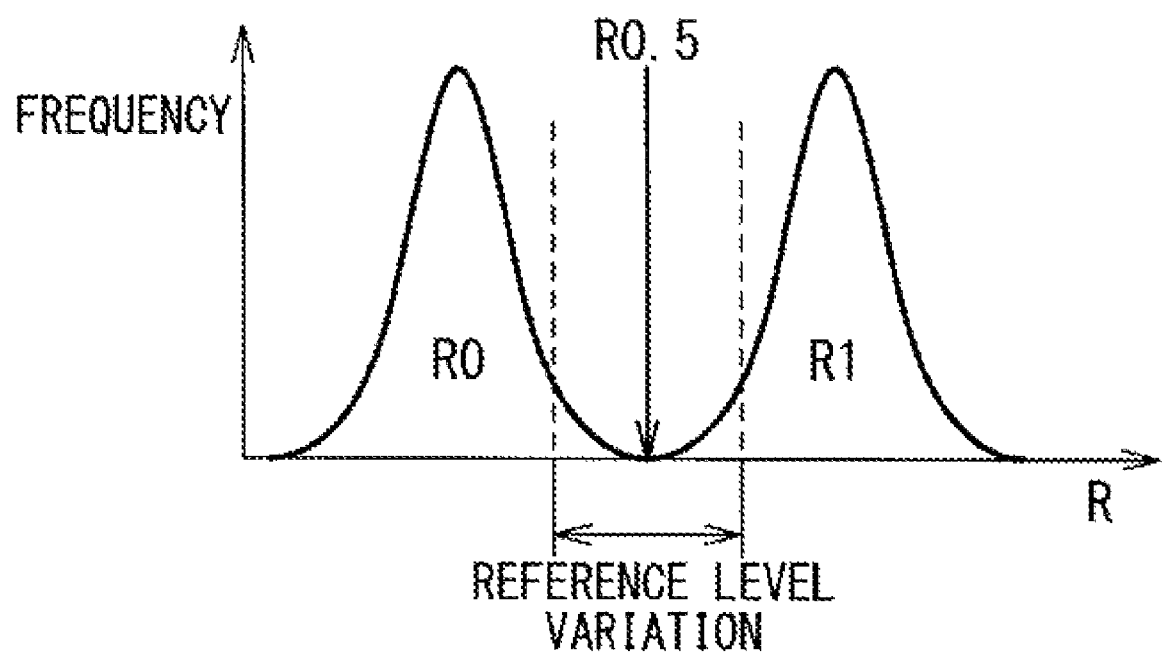
FIG. 18 is a histogram for explaining variation in a reference level.

FIG. 18 conceptually shows distributions of the data "0" cells and the data "1" cells, and a vertical axis and a horizontal axis thereof respectively represent frequency and the MTJ resistance value. As stated above, the resistance value R0 varies between the data "0" cells and the resistance value R1 varies between the data "1" cells. Therefore, when the reference level is generated by referring to the two kinds of reference cells RC0 and RC1 in which complementary data are respectively stored, the reference level varies and becomes uncertain. Such the uncertain reference level increases the probability of erroneous data reading.

3. Second Magnetoresistance Element

Therefore, according to the present exemplary embodiment, a "second magnetoresistance element 100" that is different from the first magnetoresistance element 1 is proposed for use in the reference cell. As will be described later, a resistance value of the second magnetoresistance element 100 is fixed to an intermediate value (hereinafter referred to as "R0.5"; see FIG. 18) between the above-described R0 and R1. That is, the second magnetoresistance element 100 is formed beforehand such that the resistance value thereof is R0.5 independently. By applying such the second magnetoresistance element 100 to the reference cell, the variation in the reference level can be prevented.

3-1. Example (1)

Figure 19A:
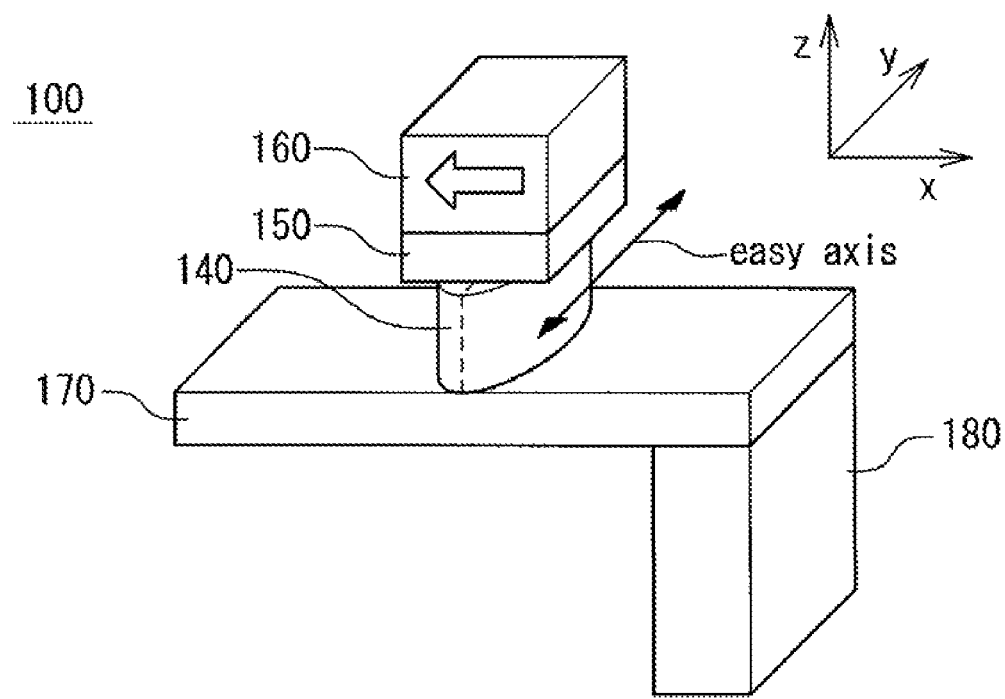
FIG. 19A is a perspective view showing an example of a second magnetoresistance element according to the exemplary embodiment of the present invention.
Figure 19B:
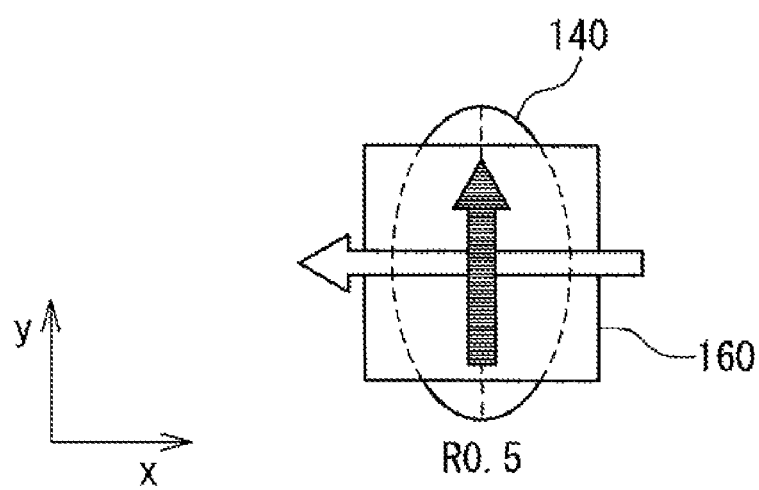
FIG. 19B is a plan view showing magnetization state of the second magnetoresistance element shown in FIG. 19A.

FIG. 19A is a perspective view showing an example of the second magnetoresistance element 100 according to the present exemplary embodiment. FIG. 19B is a plan view showing magnetization state of the second magnetoresistance element 100 shown in FIG. 19A. The second magnetoresistance element 100 according to the present example has a structure similar to that obtained by omitting the write layer group (10 to 30) from the first magnetoresistance element 1 shown in the foregoing FIG. 15.

More specifically, the second magnetoresistance element 100 has a third magnetization free layer 140, a third spacer layer 150, a third magnetization fixed layer 160, a third conductive layer 170 and a fourth conductive layer 180. The third magnetization free layer 140 is provided adjacent to one surface of the third spacer layer 150, and the third magnetization fixed layer 160 is provided adjacent to the other surface of the third spacer layer 150. That is, the third spacer layer 150 is sandwiched between the third magnetization free layer 140 and the third magnetization fixed layer 160. The third conductive layer 170 is electrically connected to the third magnetization free layer 140, and the fourth conductive layer 180 is electrically connected to the third conductive layer 170.

The third magnetization free layer 140 and the third magnetization fixed layer 160 each is a ferromagnetic layer formed of ferromagnetic material. Moreover, the third magnetization free layer 140 and the third magnetization fixed layer 160 each is an in-plane magnetization film having the in-plane magnetic anisotropy. The in-plane magnetization film is formed of ferromagnetic material including at least one material selected from Fe, Co and Ni. In addition to that, the magnetic characteristics can be controlled by adding B, C, N, O, Al, Si, P, Ti, V, Cr, Mn, Cu, Zn, Zr, Nb, Mo, Tc, Ru, Rh, Ag, Hf, Ta, W, Re, Os, Ir, Au and the like. Concrete examples of the material include Ni—Fe, Co—Fe, Fe—Co—Ni, Ni—Fe—Zr, Co—Fe—B and Co—Fe—Zr—B. The third spacer layer 150 is a nonmagnetic layer formed of nonmagnetic material. It is particularly preferable that the third spacer layer 150 is formed of insulating material. Concrete examples of the material include Mg—O, Al—O, Al—N, Ni—O and Hf—O. The third magnetization free layer 140, the third spacer layer 150 and the third magnetization fixed layer 160 form an MTJ.

In the second magnetoresistance element 100, a magnetization direction of the third magnetization fixed layer 160 is fixed in an in-plane direction. For example, in FIGS. 19A and 19B, the magnetization direction of the third magnetization fixed layer 160 is fixed in the –x-direction. The fixation of the magnetization direction can be achieved by the same manner as in the case of the first magnetoresistance element 1. Whereas, a magnetization easy axis of the third magnetization free layer 140 is perpendicular to the magnetization direction of the third magnetization fixed layer 160. In other words, the magnetization easy axis of the third magnetization free layer 140 is perpendicular to the x-direction and parallel to the y-direction. Particularly, in the example shown in FIG. 19A and FIG. 19B, a planar shape of the third magnetization free layer 140 is ellipse and the long axis of the ellipse is along the y-direction.

The above-described third magnetization free layer 140, third spacer layer 150 and third magnetization fixed layer 160 constitute a "read layer group". That is, at the time of data reading, the read current is supplied between the third magnetization free layer 140 and the third magnetization fixed layer 160 so as to pass through the MTJ. Meanwhile, the second magnetoresistance element 100 according to the present example is not provided with a structure corresponding to the write layer group. In other words, a perpendicular magnetization film that remotely affects magnetization state of the third magnetization free layer 140 of the read layer group is not provided.

Therefore, as shown in FIG. 19B, the magnetization direction of the third magnetization free layer 140 is along the magnetization easy axis direction thereof (the y-axis direction). In the example shown in FIG. 19B, the magnetization direction of the third magnetization free layer 140 is the +y-direction. On the other hand, the magnetization direction of the third magnetization fixed layer 160 is fixed in a direction perpendicular to the magnetization easy axis of the third magnetization free layer 140. Therefore, the resistance value of the read layer group is the above-mentioned intermediate value "R0.5" between R0 and Ri. That is, the second magnetoresistance element 100 is formed beforehand such that the MTJ resistance value is "R0.5" independently.

3-2. Example (2)

Figure 20A:
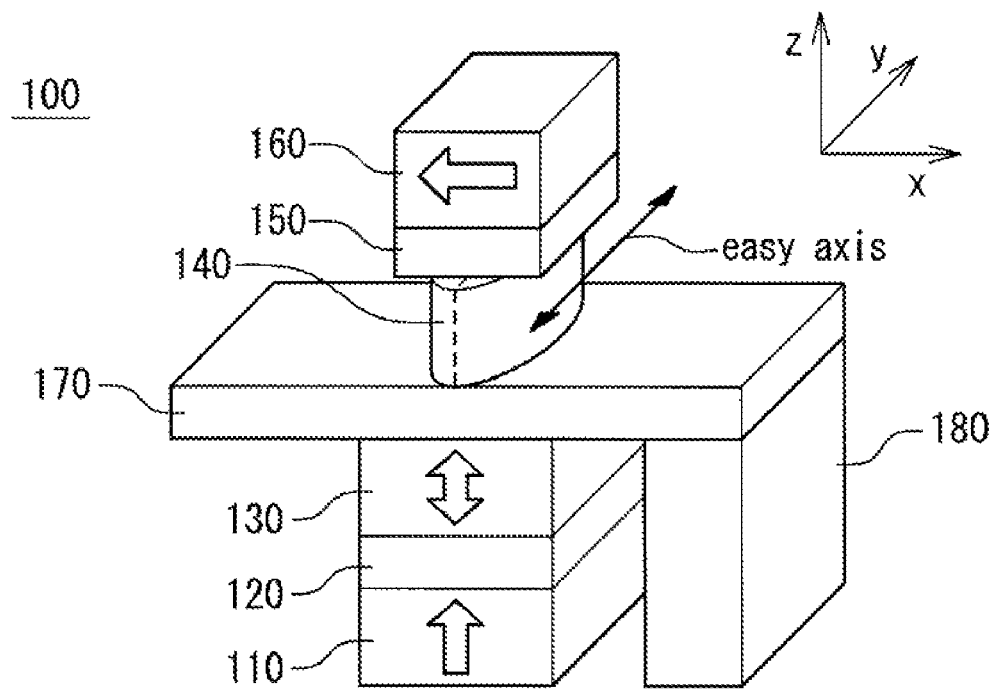
FIG. 20A is a perspective view showing another example of the second magnetoresistance element according to the exemplary embodiment of the present invention.
Figure 20B:
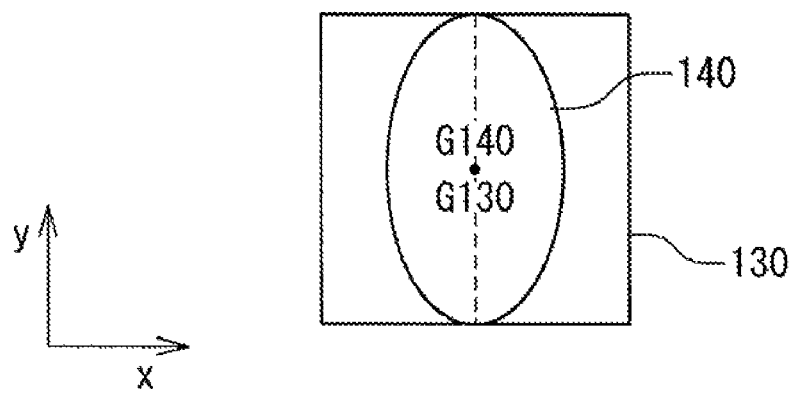
FIG. 20B is a x-y plan view of the structure shown in FIG. 20A.

FIG. 20A is a perspective view showing another example of the second magnetoresistance element 100. FIG. 20B is a x-y plan view of the structure shown in FIG. 20A. The second magnetoresistance element 100 according to the present example has not only the structure shown in FIGS. 19A and 19B but also a structure corresponding to the write layer group (10 to 30) of the first magnetoresistance element 1. It should be noted that, although the centers are displaced on purpose in the case of the first magnetoresistance element 1, centers are coincident with each other in the second magnetoresistance element 100 according to the present example. The same reference numerals are given to the same components as those described in FIGS. 19A and 19B, and an overlapping description will be omitted as appropriate.

As shown in FIG. 20A, the second magnetoresistance element 100 further has a fourth magnetization fixed layer 110, a fourth spacer layer 120 and a fourth magnetization free layer 130 in addition to the read layer group (140 to 160). The fourth magnetization fixed layer 110 is provided adjacent to one surface of the fourth spacer layer 120, and the fourth magnetization free layer 130 is provided adjacent to the other surface of the fourth spacer layer 120. That is, the fourth spacer layer 120 is sandwiched between the fourth magnetization fixed layer 110 and the fourth magnetization free layer 130. The third conductive layer 170 is sandwiched between the fourth magnetization free layer 130 and the third magnetization free layer 140. The fourth conductive layer 180 may not be provided.

The fourth magnetization fixed layer 110 and the fourth magnetization free layer 130 each is a ferromagnetic film formed of ferromagnetic material. Moreover, the fourth magnetization fixed layer 110 and the fourth magnetization free layer 130 each is a perpendicular magnetization film having the perpendicular magnetic anisotropy, and materials thereof is the same as in the case of the perpendicular magnetization film of the first magnetoresistance element 1. A magnetization direction of the fourth magnetization fixed layer 110 is substantially fixed, while a magnetization direction of the fourth magnetization free layer 130 is reversible. For example, in FIG. 20A, the magnetization direction of the fourth magnetization fixed layer 110 is fixed in the +z-direction, and the magnetization direction of the fourth magnetization free layer 130 is the +z-direction or the −z-direction. The fourth spacer layer 120 is a nonmagnetic layer formed of nonmagnetic material. Material of the fourth spacer layer 120 can be any of conductor, insulator and semiconductor.

The fourth magnetization free layer 130 having the perpendicular magnetic anisotropy and the above-mentioned third magnetization free layer 140 having the in-plane magnetic anisotropy in the read layer group are magnetically coupled to each other. However, as shown in FIG. 20B, center G130 of the fourth magnetization free layer 130 and center G140 of the third magnetization free layer 140 are coincident with each other in the x-y plane. Therefore, the perpendicular magnetization of the fourth magnetization free layer 130 does not change the direction of the in-plane magnetization of the third magnetization free layer 140. The magnetization direction of the third magnetization free layer 140 remains parallel to the magnetization easy axis thereof. That is, the read layer group is in the state shown in the foregoing FIG. 19B, and thus the "R0.5" is achieved.

3-3. Example (3)

Figure 21A:
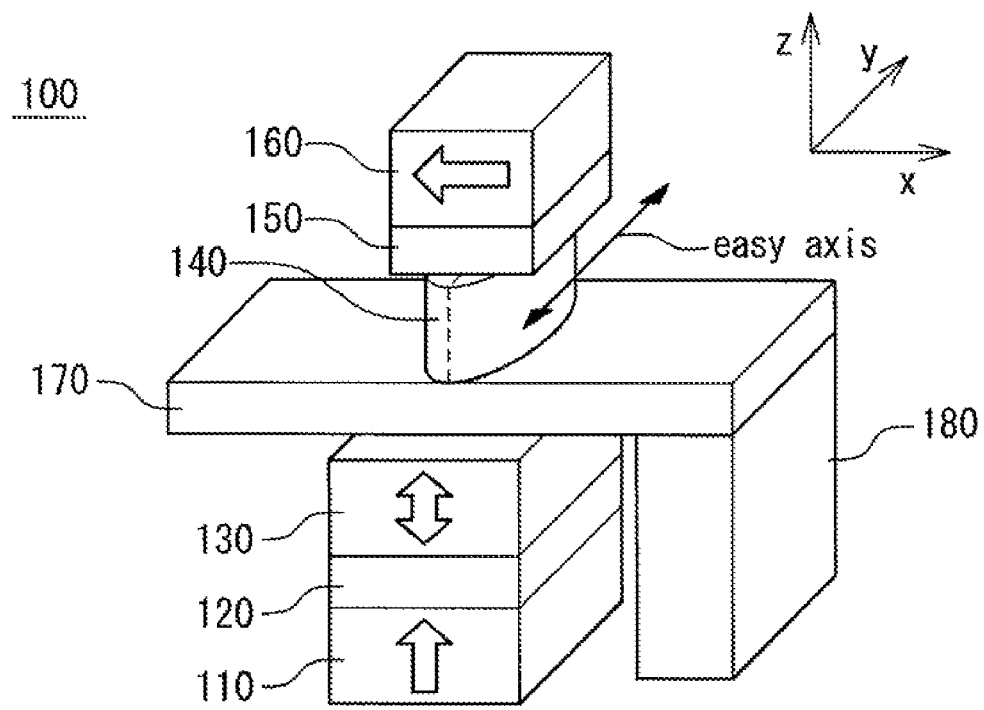
FIG. 21A is a perspective view showing still another example of the second magnetoresistance element according to the exemplary embodiment of the present invention.
Figure 21B:
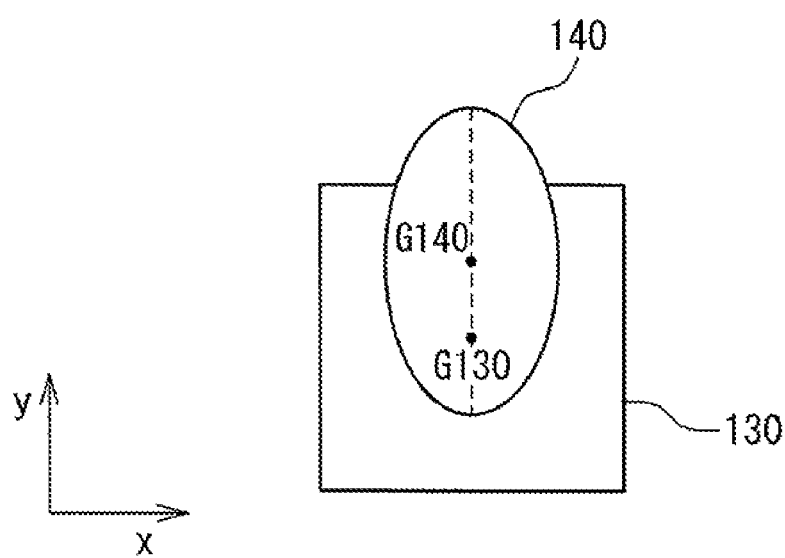
FIG. 21B is a x-y plan view of the structure shown in FIG. 21A.

FIG. 21A is a perspective view showing still another example of the second magnetoresistance element 100. FIG. 21B is a x-y plan view of the structure shown in FIG. 21A. The second magnetoresistance element 100 according to the present example has the same components as those shown in FIGS. 20A and 20B. However, a positional relationship of the centers is different. The same reference numerals are given to the same components as those described in FIGS. 20A and 20B, and an overlapping description will be omitted as appropriate.

According to the present example, the center G130 of the fourth magnetization free layer 130 having the perpendicular magnetic anisotropy is displaced from the center G140 of the third magnetization free layer 140 having the in-plane magnetic anisotropy. In the x-y plane, the displacement direction is consistent with the magnetization easy axis direction of the third magnetization free layer 140. For example, as shown in FIG. 21B, the center G130 of the fourth magnetization free layer 130 is displaced in the y-direction from the center G140 of the third magnetization free layer 140. The displacement direction is parallel to the magnetization easy axis direction (y-axis direction) of the third magnetization free layer 140 and perpendicular to the magnetization direction of the third magnetization fixed layer 160.

In this case, the perpendicular magnetization of the fourth magnetization free layer 130 applies a magnetization component in the +y-direction or in the −y-direction to the third magnetization free layer 140. Since the magnetization component is consistent with the magnetization easy axis direction, the in-plane magnetization of the third magnetization free layer 140 does not rotate. The magnetization direction of the third magnetization free layer 140 remains parallel to the magnetization easy axis thereof. That is, the read layer group is in the state shown in the foregoing FIG. 19B, and thus the "R0.5" is achieved.

Figure 22A:
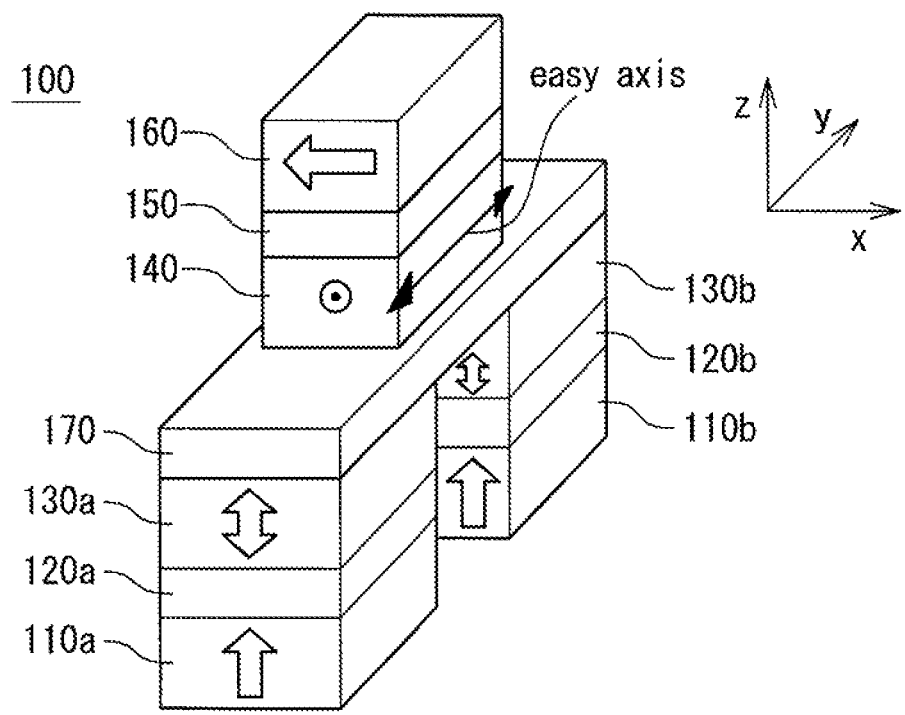
FIG. 22A is a perspective view showing still another example of the second magnetoresistance element according to the exemplary embodiment of the present invention.
Figure 22B:
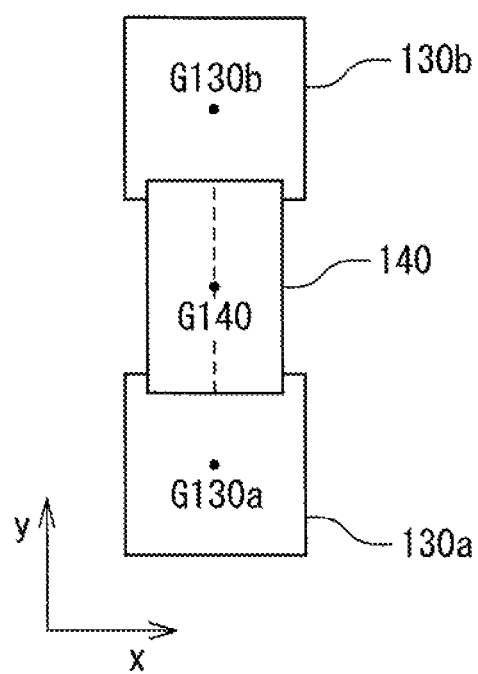
FIG. 22B is a x-y plan view of the structure shown in FIG. 22A.

FIG. 22A is a perspective view showing still another example of the second magnetoresistance element 100. FIG. 22B is a x-y plan view of the structure shown in FIG. 22A. The second magnetoresistance element 100 shown in FIGS. 22A and 22B has not only the read layer group (140 to 160) but also a plurality of layer groups each having the fourth magnetization fixed layer 110, the fourth spacer layer 120 and the fourth magnetization free layer 130 as in the case of the first magnetoresistance element 1 shown in the foregoing FIGS. 9A to 9C. In the example shown, the first layer group has the fourth magnetization fixed layer 110a, the fourth spacer layer 120a and the fourth magnetization free layer 130a, and the second layer group has the fourth magnetization fixed layer 110b, the fourth spacer layer 120b and the fourth magnetization free layer 130b.

As in the case of the foregoing example shown in FIGS. 21A and 21B, centers G130a and G130b of the fourth magnetization free layers 130a and 130b having the perpendicular magnetic anisotropy are displaced from the center G140 of the third magnetization free layer 140 having the in-plane magnetic anisotropy. In the x-y plane, the displacement direction is consistent with the magnetization easy axis direction of the third magnetization free layer 140. For example, as shown in FIG. 22B, the centers G130a, G140 and G130b align in this order along the y-axis. That is, the centers G130a and G130b are respectively displaced in the −y-direction and in the +y-direction from the center G140. The displacement direction is parallel to the magnetization easy axis direction (y-axis direction) of the third magnetization free layer 140 and perpendicular to the magnetization direction of the third magnetization fixed layer 160.

In this case, the perpendicular magnetization of the fourth magnetization free layers 130a and 130b each applies a magnetization component in the +y-direction or in the −y-direction to the third magnetization free layer 140. Since the magnetization component is consistent with the magnetization easy axis direction, the in-plane magnetization of the third magnetization free layer 140 does not rotate. The magnetization direction of the third magnetization free layer 140 remains parallel to the magnetization easy axis thereof. That is, the read layer group is in the state shown in the foregoing FIG. 19B, and thus the "R0.5" is achieved.

It should be noted that the directions of the in-plane magnetization components applied to the third magnetization free layer 140 by the respective fourth magnetization free layers 130a and 130b are consistent with each other. As a result, the direction of the in-plane magnetization of the third magnetization free layer 140 becomes more stable. For example, in the case shown in FIG. 22B where the center G140 is located between the centers G130a and G130b, it is preferable that the perpendicular magnetization directions of the respective fourth magnetization free layers 130a and 130b are opposite to each other.

4. MRAM

Figure 23:
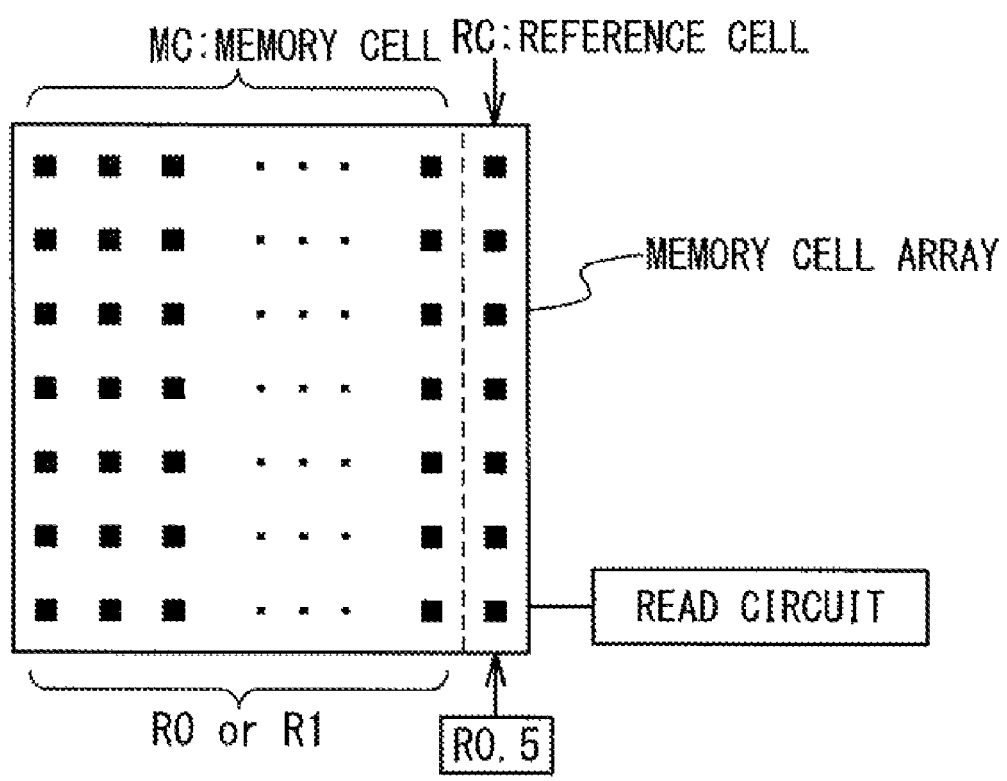
FIG. 23 is a schematic view showing a configuration of an MRAM according to the exemplary embodiment of the present invention.

FIG. 23 schematically shows a configuration of an MRAM according to the exemplary embodiment of the present invention. A memory cell array of the MRAM has a plurality of cells that are arranged in a matrix form. More specifically, the cells include a memory cell MC used for storing data and a reference cell RC that is referred to for generating a reference level at the time of data reading. According to the present invention, the first magnetoresistance element 1 is applied to the memory cell MC. On the other hand, the second magnetoresistance element 100 is applied to the reference cell RC.

From a viewpoint of manufacturing process, it is preferable that respective layers of the first magnetoresistance element 1 and respective layers of the second magnetoresistance element 100 are formed in the same layers. For example, in a case where the second magnetoresistance element 100 shown in FIG. 19A is used, the third magnetization free layer 140, the third spacer layer 150, the third magnetization fixed layer 160 and the third conductive layer 170 are respectively formed in the same layers as the second magnetization free layer 40, the second spacer layer 50, the second magnetization fixed layer 60 and the first conductive layer 70 of the first magnetoresistance element 1. In a case where the second magnetoresistance element 100 shown in FIG. 20A, 21A or 22A is used, the fourth magnetization fixed layer 110, the fourth spacer layer 120 and the fourth magnetization free layer 130 also are respectively formed in the same layers as the first magnetization fixed layer 10, the first spacer layer 20 and the first magnetization free layer 30 of the first magnetoresistance element 1.

The first magnetoresistance element 1 included in the memory cell MC can be any of the foregoing examples (refer to FIGS. 1A to 13B, 15 and 16). Moreover, the second magnetoresistance element 100 included in the reference cell RC can be any of the foregoing examples (refer to FIGS. 19A to 22B). That is, combination of the first magnetoresistance element 1 and the second magnetoresistance element 100 is arbitrary. On determining the combination, ease of the manufacturing process may be taken into consideration. For example, in the case where the first magnetoresistance element 1 shown in FIGS. 9A to 9C is used, the second magnetoresistance element 100 shown in FIGS. 22A and 22B that has a similar structure is preferably used. In either combination, the resistance value of the read layer group (40 to 60) of the first magnetoresistance element 1 is switched between R0 and R1 depending on the memory data, while the resistance value of the read layer group (140 to 160) of the second magnetoresistance element 100 is fixed to the intermediate value "R0.5".

At the time of data reading, the read current is supplied to a read-target memory cell MC and the reference cell RC. Based on the read current flowing in the memory cell MC, a read circuit generates a read-out level depending on the memory data (R0 or R1) of the memory cell MC. Moreover, based on the read currents flowing in the reference cell RC, the read circuit generates a reference level corresponding to the intermediate resistance value R0.5. Then, the read circuit compares the read-out level with the reference level to determine the memory data (R0 or R1) of the memory cell MC.

Figure 24:
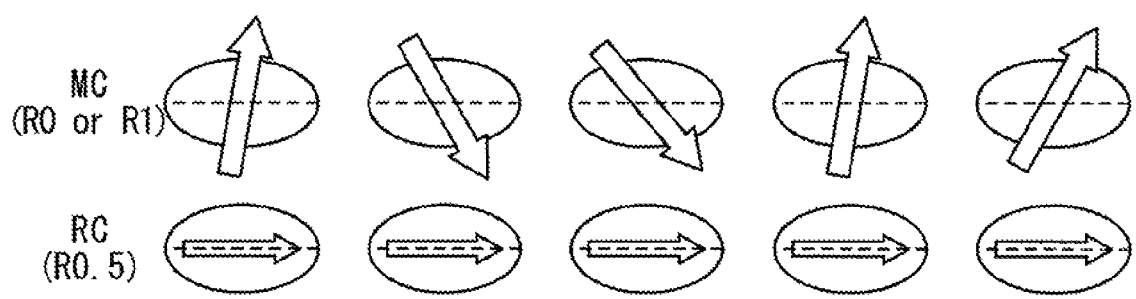
FIG. 24 is a conceptual diagram showing magnetization state of a memory cell and a reference cell according to the exemplary embodiment of the present invention.

FIG. 24 shows an example of the magnetization states of the second magnetization free layer 40 of the memory cell MC and the third magnetization free layer 140 of the reference cell RC. Here, the first magnetoresistance element 1 shown in FIGS. 15 and 16 is applied to the memory cell MC. That is, the magnetization of the second magnetization free layer 40 rotates from the magnetization easy axis as a center. The magnetization rotation amount (resistance value R0) varies between the memory cells MC of the data "0", and the magnetization rotation amount (resistance value R1) varies between the memory cells MC of the data "1" (see also FIG. 17). On the other hand, in the reference cell RC, the magnetization direction of the third magnetization free layer 140 is completely along the magnetization easy axis. Therefore, even when the magnetization rotation amount is varied in the memory cells MC, it is possible to correctly determine the magnetization rotation direction, namely the memory data (R0 or R1).

The description above can be generalized as follows. Regarding the memory cell MC, the resistance value R0 may vary between the data "0" cells and the resistance value R1 may vary between the data "1" cells. However, according to the present exemplary embodiment, the reference cell RC is certainly set to the "R0.5", and thus variation in the resistance value is hardly caused at least with regard to the reference cell RC. This means that variation in the reference level is suppressed and a more correct reference level can be obtained. By using the correct reference level (R0.5), it is possible to correctly determine the memory data (R0 or R1) of the memory cell MC (refer to FIG. 18).

As described above, according to the present exemplary embodiment, the variation in the reference level can be suppressed by applying the second magnetoresistance element 100 to the reference cell RC. As a result, erroneous data reading can be suppressed. The first magnetoresistance element 1 applied to the memory cell MC can be any of the foregoing examples. What is important is that the variation in the magnetization state can be suppressed in the reference cells RC.

Moreover, according to the present exemplary embodiment, the second magnetoresistance element 100 whose resistance value is R0.5 independently is used. Therefore, there is no need to prepare the two kinds of reference cells RC0 and RC1 (refer to FIG. 14) in which complementary data (R0, R1) are respectively stored. A single kind of reference cell RC (refer to FIG. 23) having the second magnetoresistance element 100 is sufficient.

In the case of FIG. 14, it is necessary to initially set the complementary data in the respective reference cells RC0 and RC1 by using the set controller. According to the present exemplary embodiment, on the other hand, the reference cell RC is so formed beforehand as to have the resistance value of R0.5, and thus no initial setting process is required for the reference cell RC. Therefore, a manufacturing time is shortened and manufacturing costs are reduced. Moreover, since there is no need to provide the controller for use in the initial setting, an area of the MRAM can be reduced.

Moreover, in the case of FIG. 14, the read circuit needs to refer to the two kinds of the reference cells RC0 and RC1 to calculate the reference level corresponding to the intermediate resistance value of the resistance values R0 and R1. In the case of FIG. 23, on the other hand, the reference level can be obtained directly by referring to the single kind of the reference cell RC whose resistance value is fixed to the R0.5. Therefore, a circuit configuration is simplified and thus the area of the MRAM can be reduced.

Furthermore, in the case of FIG. 14, two columns are required for placing the two kinds of the reference cells RC0 and RC1. In the case of FIG. 23, on the other hand, one column is sufficient for placing the single kind of the reference cell RC. Since a region for the reference cells is made unnecessary by one column, the area of the memory cell array can be reduced. In particular, the area reduction effect becomes remarkable in a case of a small-scale array.

While the exemplary embodiments of the present invention have been described above with reference to the attached drawings, the present invention is not limited to these exemplary embodiments and can be modified as appropriate by those skilled in the art without departing from the spirit and scope of the present invention.

The invention claimed is:

1. A magnetic random access memory comprising:
a memory cell including a first magnetoresistance element; and
a reference cell including a second magnetoresistance element, which is referred to for generating a reference level at a time of data reading from said memory cell,
wherein said first magnetoresistance element comprises:
a first magnetization fixed layer whose magnetization direction is fixed;
a first magnetization free layer whose magnetization direction is variable;
a first nonmagnetic layer sandwiched between said first magnetization fixed layer and said first magnetization free layer;
a second magnetization fixed layer whose magnetization direction is fixed;
a second magnetization free layer whose magnetization direction is variable; and
a second nonmagnetic layer sandwiched between said second magnetization fixed layer and said second magnetization free layer,
wherein said first magnetization fixed layer and said first magnetization free layer have perpendicular magnetic anisotropy,
said second magnetization fixed layer and said second magnetization free layer have in-plane magnetic anisotropy,
said first magnetization free layer and said second magnetization free layer are magnetically coupled to each other, and
center of said second magnetization free layer is displaced in a first direction from center of said first magnetization free layer in a first plane parallel to each layer,
wherein said second magnetoresistance element comprises:
a third magnetization free layer whose magnetization easy axis is parallel to a second direction;
a third magnetization fixed layer whose magnetization direction is fixed in a third direction perpendicular to said second direction; and
a third nonmagnetic layer sandwiched between said third magnetization fixed layer and said third magnetization free layer,
wherein said third magnetization fixed layer and said third magnetization free layer have in-plane magnetic anisotropy.

2. The magnetic random access memory according to claim 1,
wherein a magnetization easy axis of said second magnetization free layer is perpendicular to said first direction, and
the magnetization direction of said second magnetization fixed layer is parallel to or anti-parallel to said first direction.

3. The magnetic random access memory according to claim 1,
wherein a long axis direction of a planar shape of said third magnetization free layer is said second direction.

4. The magnetic random access memory according to claim 1,
wherein said second magnetization fixed layer and said third magnetization fixed layer are formed in a same layer,
said second magnetization free layer and said third magnetization free layer are formed in a same layer, and
said second nonmagnetic layer and said third nonmagnetic layer are formed in a same layer.

5. The magnetic random access memory according to claim 1,
wherein said second magnetoresistance element further comprises:
a fourth magnetization fixed layer whose magnetization direction is fixed;
a fourth magnetization free layer whose magnetization direction is variable; and
a fourth nonmagnetic layer sandwiched between said fourth magnetization fixed layer and said fourth magnetization free layer,
wherein said fourth magnetization fixed layer and said fourth magnetization free layer have perpendicular magnetic anisotropy,
said third magnetization free layer and said fourth magnetization free layer are magnetically coupled to each other, and
a magnetization direction of said third magnetization free layer is parallel to said second direction.

6. The magnetic random access memory according to claim 5,
wherein in said first plane, center of said third magnetization free layer is coincident with center of said fourth magnetization free layer.

7. The magnetic random access memory according to claim 5,
wherein in said first plane, center of said third magnetization free layer is displaced in said second direction from center of said fourth magnetization free layer.

8. The magnetic random access memory according to claim 5,
wherein said second magnetization fixed layer and said third magnetization fixed layer are formed in a same layer,
said second magnetization free layer and said third magnetization free layer are formed in a same layer,
said second nonmagnetic layer and said third nonmagnetic layer are formed in a same layer,
said first magnetization fixed layer and said fourth magnetization fixed layer are formed in a same layer,
said first magnetization free layer and said fourth magnetization free layer are formed in a same layer, and
said first nonmagnetic layer and said fourth nonmagnetic layer are formed in a same layer.

9. The magnetic random access memory according to claim 1,
wherein a write current flows between said first magnetization free layer and said first magnetization fixed layer at a time of data writing to said memory cell, and
a read current flows between said second magnetization free layer and said second magnetization fixed layer at the time of data reading from said memory cell.

10. The magnetic random access memory according to claim 9,
wherein said write current further flows between said second magnetization free layer and said second magnetization fixed layer.

11. The magnetic random access memory according to claim 1,
wherein said first magnetoresistance element comprises a plurality of write layer groups, and
each of said plurality of write layer groups comprises said first magnetization fixed layer, said first magnetization free layer and said first nonmagnetic layer.

12. The magnetic random access memory according to claim 11,
wherein said plurality of write layer groups include a first write layer group and a second write layer group, and
wherein in said first plane, the center of said second magnetization free layer is located between the center of said first magnetization free layer of said first write layer group and the center of said first magnetization free layer of said second write layer group.

13. The magnetic random access memory according to claim 12,
wherein the magnetization direction of said first magnetization free layer of said first write layer group is anti-parallel to the magnetization direction of said first magnetization free layer of said second write layer group, and
the magnetization direction of said first magnetization fixed layer of said first write layer group is parallel to the magnetization direction of said first magnetization fixed layer of said second write layer group.

14. The magnetic random access memory according to claim 13,
wherein a write current flows between said first magnetization free layer and said first magnetization fixed layer in each of said first write layer group and said second write layer group at a time of data writing, and
a direction of said write current flowing in said first write layer group is opposite to a direction of said write current flowing in said second write layer group.

* * * * *